United States Patent
Henke et al.

(10) Patent No.: US 10,964,490 B2
(45) Date of Patent: Mar. 30, 2021

(54) POWER CONTACT HEALTH ASSESSOR APPARATUS AND METHOD

(71) Applicant: Arc Suppression Technologies, Bloomington, MN (US)

(72) Inventors: Reinhold Henke, Alexandria, MN (US); Robert Thorbus, Chanhassen, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

(21) Appl. No.: 16/776,131

(22) Filed: Jan. 29, 2020

(65) Prior Publication Data

US 2020/0243269 A1 Jul. 30, 2020

Related U.S. Application Data

(60) Provisional application No. 62/798,316, filed on Jan. 29, 2019, provisional application No. 62/798,323, (Continued)

(51) Int. Cl.
*H01H 1/00* (2006.01)
*G01R 31/327* (2006.01)
(Continued)

(52) U.S. Cl.
CPC ....... *H01H 1/0015* (2013.01); *G01R 31/3277* (2013.01); *G01R 31/3278* (2013.01);
(Continued)

(58) Field of Classification Search
CPC .. G01R 31/00; G01R 31/327; G01R 31/3274; G01R 31/3277; G01R 31/3278; G01R 31/333; G01R 31/40; H01H 1/00; H01H 1/0015; H01H 9/54; H01H 9/547; H01H 2001/506; H01H 2047/008;
(Continued)

(56) References Cited

U.S. PATENT DOCUMENTS 5,420,571 A 5/1995 Coleman et al.
5,629,869 A * 5/1997 Johnson ............. H01H 11/0062
361/88
(Continued)

*Primary Examiner* — Hoai-An D. Nguyen
(74) *Attorney, Agent, or Firm* — Schwegman Lundberg & Woessner, P.A.

(57) ABSTRACT

A power contact health assessor system includes a pair of terminals adapted to be connected to a set of switchable contact electrodes of a power contact and a contact separation detector configured to determine a time of separation of the set of switchable contact electrodes during deactivation of the power contact. The system includes a controller circuit operatively coupled to the pair of terminals and the contact separation detector. The controller circuit is configured to determine within a first observation window, a plurality of contact stick durations and an average contact stick duration. One or more additional observation windows with corresponding average contact stick durations are configured. A health assessment for the set of switchable contact electrodes may be based on a subsequent contact stick duration for a contact cycle after the first observation window and the corresponding average contact stick durations for the one or more additional observation windows.

20 Claims, 4 Drawing Sheets

Related U.S. Application Data filed on Jan. 29, 2019, provisional application No. 62/798,326, filed on Jan. 29, 2019, provisional application No. 62/898,780, filed on Sep. 11, 2019, provisional application No. 62/898,783, filed on Sep. 11, 2019, provisional application No. 62/898,787, filed on Sep. 11, 2019, provisional application No. 62/898,795, filed on Sep. 11, 2019, provisional application No. 62/898,798, filed on Sep. 11, 2019.

(51) Int. Cl.

| | | |
|---|---|---|
| *H01H 50/04* | (2006.01) | |
| *G01R 31/40* | (2020.01) | |
| *H02H 1/00* | (2006.01) | |
| *H02H 3/08* | (2006.01) | |
| *H01H 9/54* | (2006.01) | |
| *H02M 3/156* | (2006.01) | |
| *H03K 3/313* | (2006.01) | |
| *H03K 17/60* | (2006.01) | |
| *H01H 1/50* | (2006.01) | |
| *H02H 3/06* | (2006.01) | |
| *H02H 3/087* | (2006.01) | |
| *H02H 7/26* | (2006.01) | |
| *H02H 9/02* | (2006.01) | |
| *H02H 9/08* | (2006.01) | |
| *H03K 3/45* | (2006.01) | |
| *H01H 47/00* | (2006.01) | |
| *H01H 71/04* | (2006.01) | |

(52) U.S. Cl.
CPC ............ *G01R 31/40* (2013.01); *H01H 9/547* (2013.01); *H01H 50/045* (2013.01); *H02H 1/0007* (2013.01); *H02H 3/08* (2013.01); *H02M 3/156* (2013.01); *H03K 3/313* (2013.01); *H03K 17/601* (2013.01); *H01H 9/54* (2013.01); *H01H 2001/506* (2013.01); *H01H 2047/008* (2013.01); *H01H 2071/044* (2013.01); *H02H 3/06* (2013.01); *H02H 3/087* (2013.01); *H02H 7/26* (2013.01); *H02H 9/02* (2013.01); *H02H 9/08* (2013.01); *H03K 3/45* (2013.01)

(58) Field of Classification Search
CPC .. H01H 2071/044; H01H 50/045; H02H 1/00; H02H 1/0007; H02H 3/06; H02H 3/08; H02H 3/087; H02H 7/26; H02H 9/02; H02H 9/08; H03K 3/313; H03K 3/45; H03K 17/601; H02M 1/32; H02M 1/44; H02M 3/156
USPC ................. 702/1, 57, 58, 127, 176, 177; 324/415–424, 500, 509, 512, 527, 531, 324/532, 535–538
See application file for complete search history.

(56) References Cited

U.S. PATENT DOCUMENTS

| | | | | |
|---|---|---|---|---|
| 7,126,445 | B1 * | 10/2006 | McMahon | H01H 71/04 335/17 |
| 7,705,601 | B2 | 4/2010 | Zhou et al. | |
| 9,197,056 | B2 * | 11/2015 | Liu | H02H 9/02 |
| 9,869,722 | B1 * | 1/2018 | Morris | G01R 31/2849 |
| 10,727,005 | B1 * | 7/2020 | Henke | H01H 9/547 |
| 10,727,010 | B1 * | 7/2020 | Henke | G01R 31/3277 |
| 10,763,659 | B2 * | 9/2020 | Henke | H02M 3/156 |
| 2008/0042794 | A1 * | 2/2008 | Darr | H01H 85/32 337/143 |
| 2010/0153022 | A1 | 6/2010 | Chen et al. | |
| 2011/0181294 | A1 * | 7/2011 | Ziegler | G01R 31/66 324/538 |
| 2012/0123698 | A1 | 5/2012 | Chen et al. | |
| 2012/0133505 | A1 * | 5/2012 | Yu | G04G 15/003 340/539.3 |
| 2013/0187389 | A1 | 7/2013 | Thangamani et al. | |
| 2016/0356852 | A1 * | 12/2016 | Lee | G01R 31/327 |
| 2017/0184675 | A1 * | 6/2017 | Freer | G01R 31/3277 |
| 2018/0323551 | A1 * | 11/2018 | Weiden | G01R 19/165 |
| 2019/0079134 | A1 * | 3/2019 | Donolo | H01H 71/04 |

\* cited by examiner

POWER CONTACT HEALTH ASSESSOR APPARATUS AND METHOD

PRIORITY

This application claims the benefit of priority to U.S. Provisional Application Ser. No. 62/798,316, filed Jan. 29, 2019; U.S. Provisional Application Ser. No. 62/798,323, filed Jan. 29, 2019; U.S. Provisional Application Ser. No. 62/798,326, filed Jan. 29, 2019; U.S. Provisional Application Ser. No. 62/898,780, filed Sep. 11, 2019, U.S. Provisional Application Ser. No. 62/898,783, filed Sep. 11, 2019, U.S. Provisional Application Ser. No. 62/898,787, filed Sep. 11, 2019, U.S. Provisional Application Ser. No. 62/898,795, filed Sep. 11, 2019, and U.S. Provisional Application Ser. No. 62/898,798, filed Sep. 11, 2019, with the contents of all of the above-listed applications being incorporated herein by reference in their entireties.

TECHNICAL FIELD

The present application relates generally to electrical contact health assessment apparatus and techniques, including electrical contacts connected in parallel or in series with each other.

BACKGROUND

Product designers, technicians, and engineers are trained to accept manufacturer specifications when selecting electromechanical relays and contactors. None of these specifications, however, indicate the serious impact of electrical contact arcing on the life expectancy of the relay or the contactor. This is especially true in high-power (e.g., over 2 Amp) applications.

Electrical current contact arcing may have a deleterious effect on electrical contact surfaces, such as relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

SUMMARY

Various examples are now described to introduce a selection of concepts in a simplified form that is further described below in the detailed description. The Summary is not intended to identify key or essential features of the claimed subject matter, nor is it intended to be used to limit the scope of the claimed subject matter.

According to a first aspect of the present disclosure, there is provided an electrical circuit including a pair of terminals adapted to be connected to a set of switchable contact electrodes of a power contact. The electrical circuit further includes a power switching circuit operatively coupled to the pair of terminals. The power switching circuit is configured to switch power from an external power source and to trigger activation of the set of switchable contact electrodes based on a first logic state signal or deactivation of the set of switchable contact electrodes based on a second logic state signal. The electrical circuit further includes a contact separation detector operatively coupled to the pair of terminals, the contact separation detector configured to determine a time of separation of the set of switchable contact electrodes of the power contact during the deactivation. The electrical circuit further includes a controller circuit operatively coupled to the pair of terminals, the power switching circuit, and the contact separation detector. The controller circuit is configured to, for each contact cycle of a plurality of contact cycles of the power contact within a first observation window, generate the second logic state signal to trigger the deactivation of the set of switchable contact electrodes. The controller further determines a contact stick duration associated with the set of switchable contact electrodes. The contact stick duration is based on a difference between a time the second logic state signal is generated and the time of separation during the contact cycle. The controller further determines an average contact stick duration for the first observation window based on the contact stick duration for each contact cycle within the first observation window. The controller further configures one or more additional observation windows with corresponding average contact stick durations based on the average stick duration for the first observation window. The controller further generates a health assessment for the set of switchable contact electrodes of the power contact based on a subsequent contact stick duration determined after the first observation window and the corresponding average contact stick durations for the one or more additional observation windows.

According to a second aspect of the present disclosure, there is provided a system including a pair of terminals adapted to be connected to a set of switchable contact electrodes of a power contact. The system further includes a contact separation detector configured to determine a time of separation of the set of switchable contact electrodes during deactivation of the power contact. The system further includes a controller circuit operatively coupled to the pair of terminals and the contact separation detector. The controller circuit is configured to determine within a first observation window, a plurality of contact stick durations associated with the set of switchable contact electrodes. Each contact stick duration of the plurality of contact stick durations is determined during a corresponding contact cycle of a plurality of contact cycles of the power contact within the first observation window and is based on a time duration between generation of a logic state signal triggering the deactivation and the time of separation of the set of switchable contact electrodes. An average contact stick duration for the first observation window is determined by the controller based on the plurality of contact stick durations. The controller further configures one or more additional observation windows with corresponding average contact stick durations. The corresponding average contact stick durations are determined based on the average stick duration for the first observation window. A health assessment for the set of switchable contact electrodes of the power contact is generated based on a subsequent contact stick duration for a contact cycle after the first observation window and the corresponding average contact stick durations for the one or more additional observation windows.

According to a third aspect of the present disclosure, there is provided a method including coupling a contact separation detector to a pair of terminals of a power contact. The contact separation detector is configured to determine a time of separation of a set of switchable contact electrodes of the power contact during deactivation of the power contact based on a logic state signal. A controller circuit is coupled to the pair of terminals and the contact separation detector. The controller circuit is configured to determine a plurality of stick durations associated with the set of switchable contact electrodes. Each stick duration of the plurality of stick durations is determined during a corresponding contact cycle of a plurality of contact cycles of the power contact within a first observation window and is based on a time duration between generation of the logic state signal triggering the deactivation and the time of separation of the set of switchable contact electrodes. An average contact stick duration is determined for the first observation window based on the plurality of contact stick durations. One or more additional observation windows with corresponding average contact stick durations are configured. The corresponding average contact stick durations are determined based on the average stick duration for the first observation window. A health assessment for the set of switchable contact electrodes of the power contact is generated based on a subsequent contact stick duration for a contact cycle after the first observation window and the corresponding average contact stick durations for the one or more additional observation windows.

Any one of the foregoing examples may be combined with any one or more of the other foregoing examples to create a new embodiment within the scope of the present disclosure.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

It should be understood at the outset that although an illustrative implementation of one or more embodiments is provided below, the disclosed systems, methods, and/or apparatuses described with respect to FIGS. 1-4 may be implemented using any number of techniques, whether currently known or not yet in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In the following description, reference is made to the accompanying drawings that form a part hereof, and in which are shown, by way of illustration, specific embodiments which may be practiced. These embodiments are described in sufficient detail to enable those skilled in the art to practice the inventive subject matter, and it is to be understood that other embodiments may be utilized, and that structural, logical, and electrical changes may be made without departing from the scope of the present disclosure. The following description of example embodiments is, therefore, not to be taken in a limiting sense, and the scope of the present disclosure is defined by the appended claims.

As used herein, the term "dry contact" (e.g., as used in connection with an interlock such as a relay or contactor) refers to a contact that is only carrying load current when closed. Such contact may not switch the load and may not make or break under load current. As used herein, the term "wet contact" (e.g., as used in connection with an interlock such as a relay or contactor) refers to a contact carrying load current when closed as well as switching load current during the make and break transitions.

Examples of power contact health assessor and components utilized therein and in conjunction with power contact health assessors are disclosed herein. Examples are presented without limitation and it is to be recognized and understood that the embodiments disclosed are illustrative and that the circuit and system designs described herein may be implemented with any suitable specific components to allow for the circuit and system designs to be utilized in a variety of desired circumstances. Thus, while specific components are disclosed, it is to be recognized and understood that alternative components may be utilized as appropriate.

Figure 2:
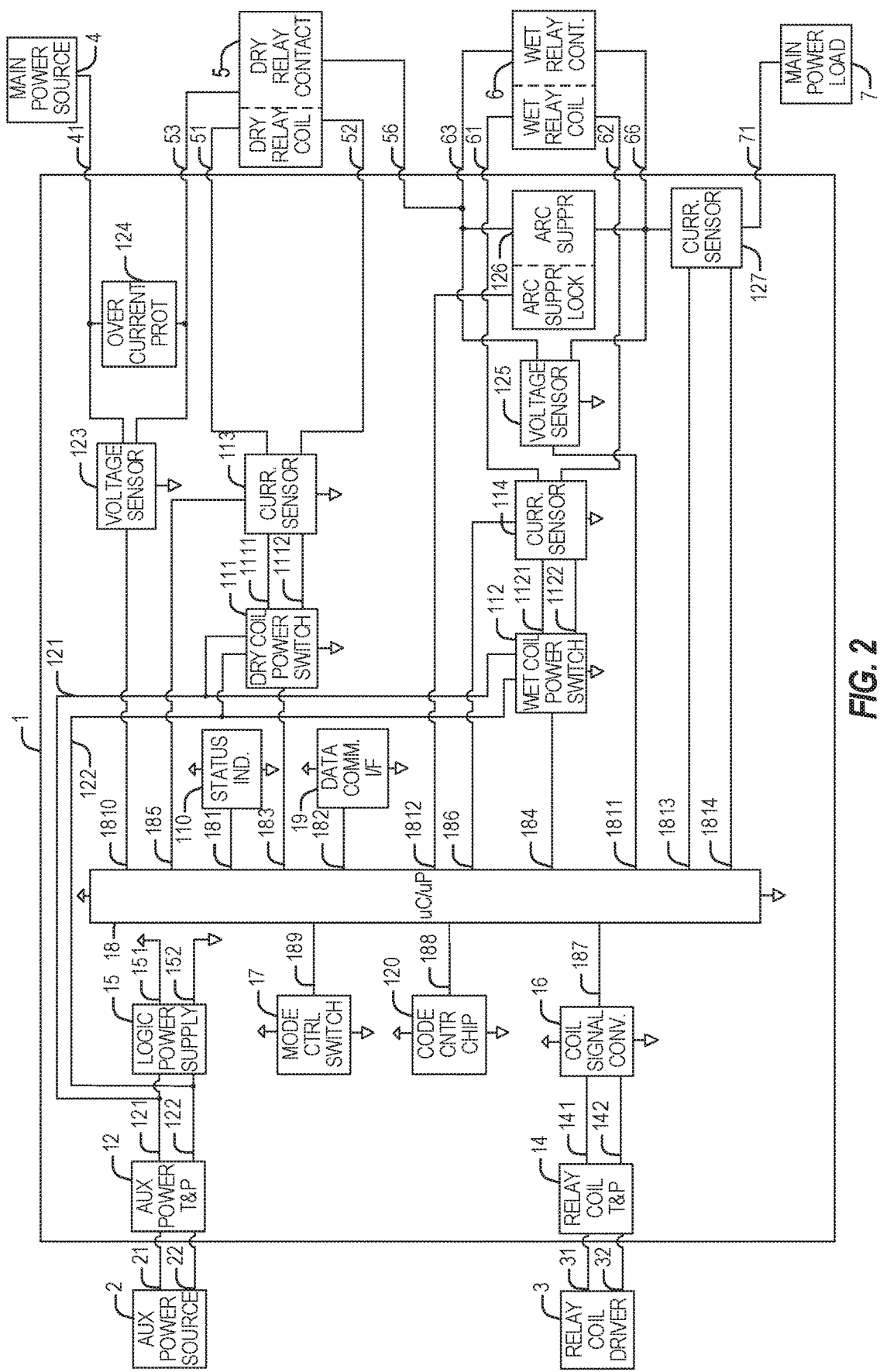
FIG. 2 is a block diagram of an example power contact health assessor, according to some embodiments.
Figure 3:
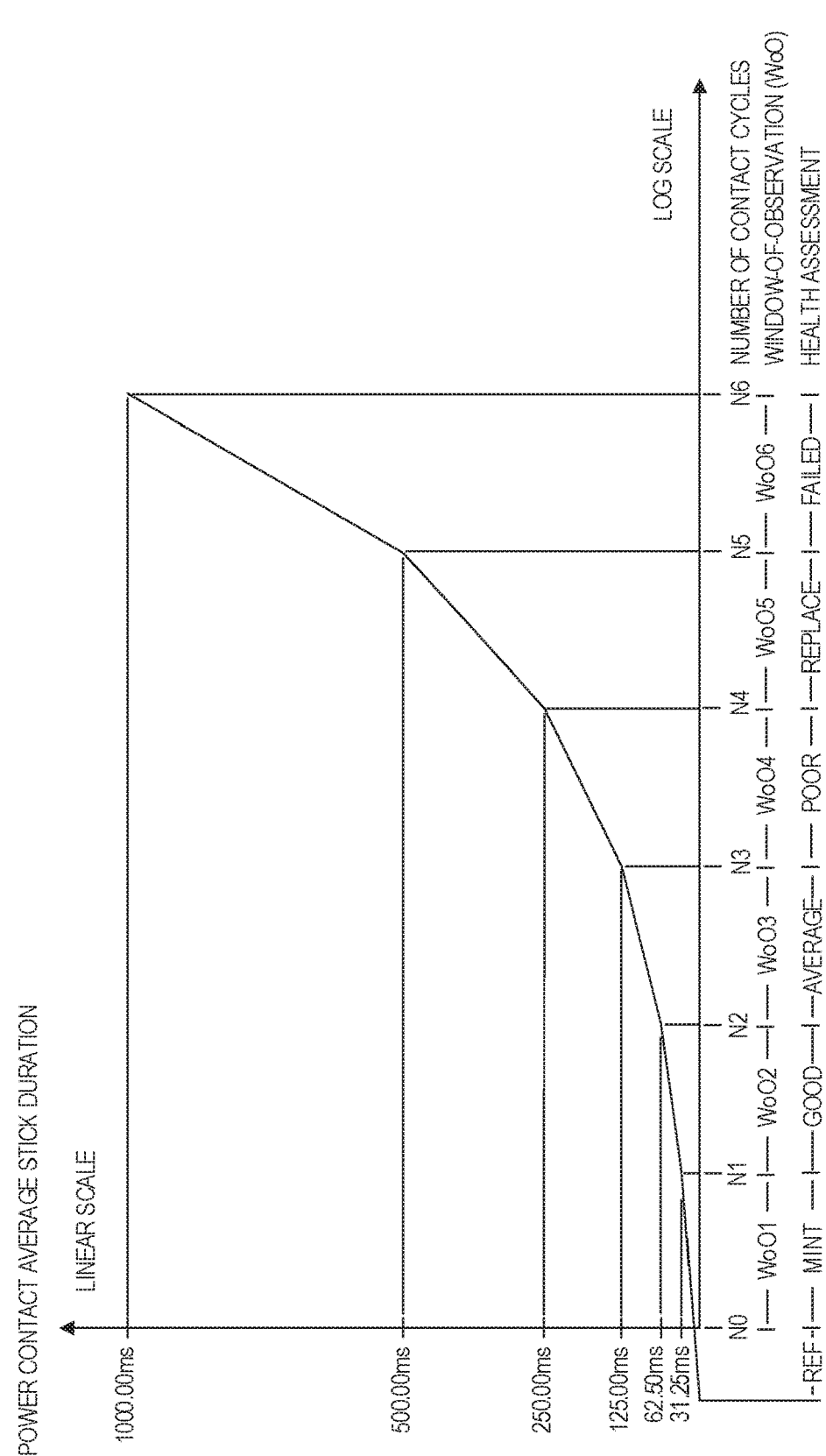
FIG. 3 depicts a logarithmic scale graph of average power contact stick duration for power contact health assessment, according to some embodiments.

Techniques disclosed herein relate to the design and configuration of a power contact health assessor (e.g., the power contact health assessor 1 of FIG. 1 and FIG. 2) to provide an indication of the condition (or health) of the contact electrodes of the power contact. The health assessment determination can be performed based on the contact stick duration or other characteristics derived based on the contact stick duration. More specifically, different windows of observation (WoO) may be configured where each window is associated with a specific contact health condition (e.g., new, good, average, poor, replace, failed). To configure the WoO, a first observation window is configured by measuring the contact stick duration for a pre-defined number of contact cycles of a power contact within the window. An average stick duration is determined based on the measured stick durations and the number of cycles within the window. An average stick duration for each subsequent window is derived using the contact stick duration of the prior window. For example, the average stick duration of the second window is twice the average stick duration of the first observation window. The average stick duration of the third observation window is twice the average stick duration of the second observation window, and so forth. The last observation window is determined when the average stick duration reaches a maximum (pre-configured) threshold value (e.g., when the average stick duration reaches 1000 ms, which is the industry standard for a failed contact). After the observation windows with corresponding average stick durations are configured, each window can be associated with a health assessment characteristic (e.g., as illustrated in FIG. 3, six observation windows may be configured for a total of 6 possible health assessment characteristics). During operation of the power contact, contact stick durations may be periodically measured and referenced against the configured observation windows to determine in which window the measured stick duration fits, and then determine the corresponding health assessment characteristic of the current state of the contact associated with the measured contact stick duration.

As used herein, the term "stick duration" refers to the time difference between coil activation/deactivation (e.g., a relay coil of a relay contact) and power contact activation/deactivation. In some aspects, the discussed power contact health assessment operations may be structured so that such operations may be configured and executed in microcontrollers and microprocessors without the need for an external/computation apparatus or method. In various examples, the power contact health assessment operations do not rely on extensive mathematical and/or calculus operations. In some aspects, the dry contactor may be optional for power contact health assessment. The dry contactor may be utilized if high dielectric isolation and extremely low leakage currents are desired.

Arc suppressor is an optional element for the power contact health assessor. In some aspects, the disclosed power contact health assessor may incorporate an arc suppression circuit (also referred to as an arc suppressor) coupled to the wet contact, to protect the wet contact from arcing during the make and break transitions and to reduce deleterious effects from contact arcing. The arc suppressor incorporated with the power contact health assessor discussed herein may include an arc suppressor as disclosed in the following issued U.S. Patents—U.S. Pat. Nos. 8,619,395 and 9,423,442, both of which are incorporated herein by reference in their entirety. A power contact arc suppressor extends the electrical life of a power contact under any rated load into the mechanical life expectancy range. Even though the figures depict a power contact health assessor 1 with an internal arc suppressor, the disclosure is not limited in this regard and the power contact health assessor 1 may also use an external arc suppressor or no arc suppressor.

When a power contact can no longer break the electrode micro weld in time, the contact is considered failed. Anecdotally, the power relay industry considers a contactor or relay contact failed if the contact stick duration exceeds one (1) second. The inevitable EoL event for any relay and contactor is a failure. Power contact EoL may be understood as the moment when a relay/contactor fails either electrically or mechanically. Power relays and contactors power contacts either fail closed, open or somewhere in between. Published power contact release times in relay and contactor datasheets are not the same as the power contact stick duration. The relay industry considers contacts with a current carrying capability of 2 A or greater, power contacts. Contacts with a current carrying capability of less than 2 A may not be considered power contacts. Conventional techniques to determine power contact condition may involve measuring power contact resistance. Such measurements, however, are performed ex-situ, using complex and expensive equipment to perform measurements.

Power contact electrode surface degradation/decay is associated with ever increasing power contact stick durations. Techniques disclosed herein may be used to perform power contact health assessment for a power contact using in-situ, real-time, stand-alone operation by, e.g., monitoring contact stick durations providing a contact health assessment based on the measured stick duration. In-situ may be understood to involve operating in an actual, real-life, application while operating under normal or abnormal conditions. Real-time may be understood to involve performance data that is actual and available at the time of measurement. For example, real-time contact separation detection may be performed using real-time voltage measurements of the power contact voltage. Stand-alone-operation requires no additional connections, devices, or manipulations other than those outlined in the present disclosure this document (e.g., the main power connection, a relay coil driver connection, and an auxiliary power source connection).

Figure 1:
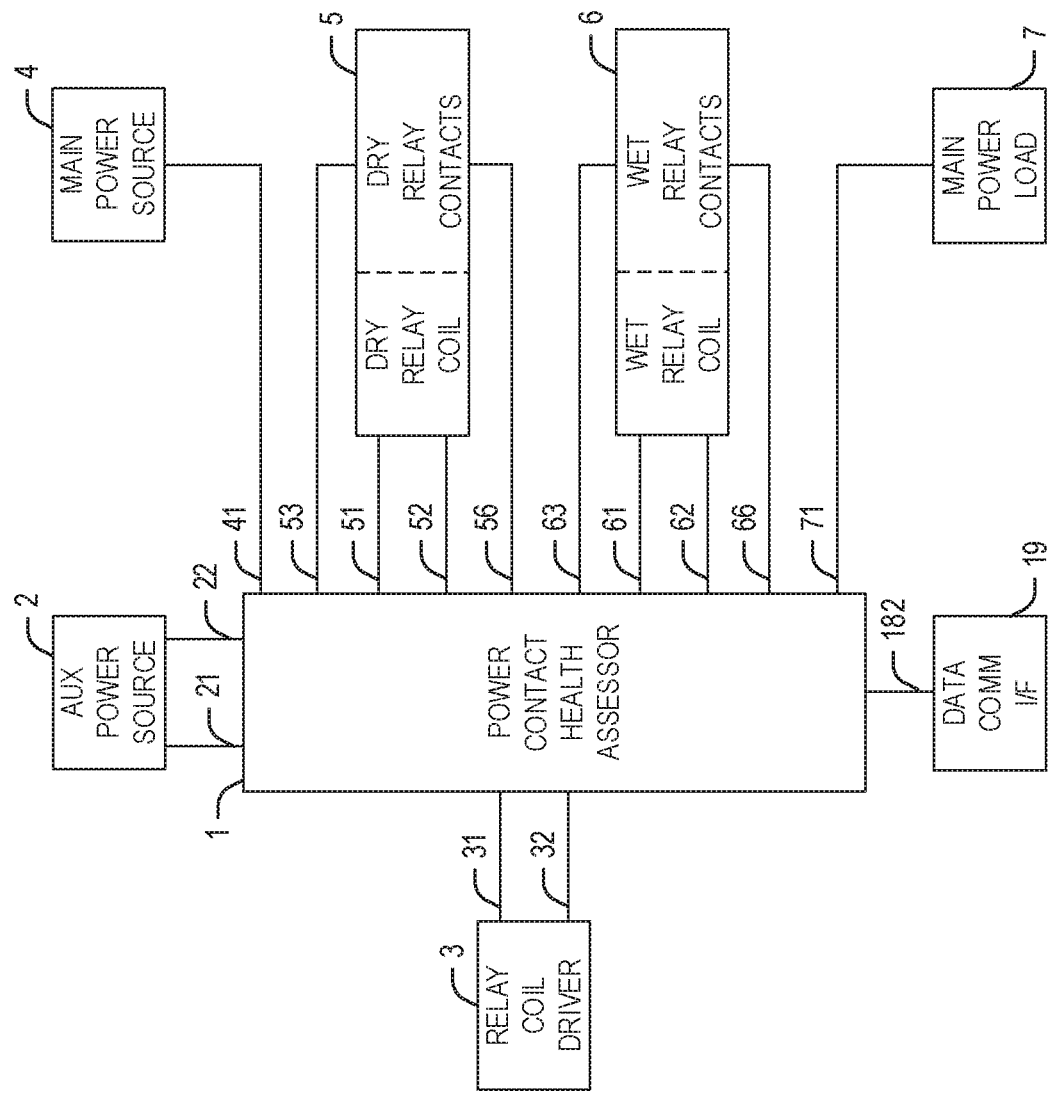
FIG. 1 is a diagram of a system including a power contact health assessor, according to some embodiments.

FIG. 1 is a diagram of a system 100 including a power contact health assessor, according to some embodiments. Referring to FIG. 1, the system 100 may include a power contact health assessor 1 coupled to an auxiliary power source 2, a relay coil driver 3, a main power source 4, a dry relay 5, a wet relay 6, a main power load 7, and a data communication interface 19.

The dry relay 5 may include a dry relay coil coupled to dry relay contacts, and the wet relay 6 may include a wet relay coil coupled to wet relay contacts. The dry relay 5 may be coupled to the main power source 4 via the power contact health assessor 1. The dry relay 5 may be coupled in series with the wet relay 6, and the wet relay 6 may be coupled to the main power load 7 via the power contact health assessor 1. Additionally, the wet relay 6 may be protected by an arc suppressor coupled across the wet relay contacts of the wet relay 6 (e.g., as illustrated in FIG. 2). Without an arc suppressor connected, the wet contactor or relay 6 contacts may become sacrificial and the dry contactor or relay 5 contacts may remain in excellent condition during normal operation of the power contact health assessor 1, ensuring that the device clears a fault condition in the case where the wet relay contacts have failed.

The main power source 4 may be an AC power source or a DC power source. Sources four AC power may include generators, alternators, transformers, and the like. Source four AC power may be sinusoidal, non-sinusoidal, or phase controlled. An AC power source may be utilized on a power grid (e.g., utility power, power stations, transmission lines, etc.) as well as off the grid, such as for rail power. Sources for DC power may include various types of power storage, such as batteries, solar cells, fuel cells, capacitor banks, and thermopiles, dynamos, and power supplies. DC power types may include direct, pulsating, variable, and alternating (which may include superimposed AC, full wave rectification, and half wave rectification). DC power may be associated with self-propelled applications, i.e., articles that drive, fly, swim, crawl dive, internal, dig, cut, etc. Even though FIG. 1 illustrates the main power source 4 as externally provided, the disclosure is not limited in this regard and the main power source may be provided internally, e.g., a battery or another power source. Additionally, the main power source 4 may be a single-phase or a multi-phase power source.

Even though FIG. 1 illustrates the power contact health assessor 1 coupled to a dry relay 5 and a wet relay 6 that include a relay coil and relay contacts, the disclosure is not limited in this regard and other types of interlock arrangements may be used as well, such as switches, contactors, or other types of interlocks. In some aspects, a contactor may be a specific, heavy duty, high current, embodiment of a relay. Additionally, the power contact health assessor 1 may be used to generate an EoL prediction for a single power contact (one of the contacts of relays 5 and 6) or multiple power contacts (contacts for both relays 5 and 6).

The dry and wet contacts associated with the dry and wet relays in FIG. 1 may each include a pair of contacts, such as electrodes. In some aspects, the main power load 7 may be a general-purpose load, such as consumer lighting, computing devices, data transfer switches, etc. In some aspects, the main power load 7 may be a resistive load, such as a resistor, heater, electroplating device, etc. In some aspects, the main power load 7 may be a capacitive load, such as a capacitor, capacitor bank, power supply, etc. In some aspects, the main power load 7 may be an inductive load, such as an inductor, transformer, solenoid, etc. In some aspects, the main power load 7 may be a motor load, such as a motor, compressor, fan, etc. In some aspects, the main power load 7 may be a tungsten load, such as a tungsten lamp, infrared heater, industrial light, etc. In some aspects, the main power load 7 may be a ballast load, such as a fluorescent light, a neon light, a light emitting diode (LED), etc. In some aspects, the main power load 7 may be a pilot duty load, such as a traffic light, signal beacon, control circuit, etc.

The auxiliary power source 2 is an external power source that provides power to the wet and dry relay coils (of the wet relay 6 and the dry relay 5, respectively) according to the power contact health assessor 1. The first auxiliary power source node 21 may be configured as a first coil power termination input (e.g., to the auxiliary power termination and protection circuit 12 in FIG. 2). The second auxiliary power source node 22 may be configured as the second coil power termination input. The auxiliary power source 2 may be a single-phase or a multi-phase power source. Additionally, the coil power source 2 may be an AC power type or a DC power type.

The relay coil driver 3 is the external relay coil signal source which provides information about the energization status for the wet relay 6 coil and the dry relay 5 coil according to the control of the power contact health assessor 1. In this regard, the relay coil driver 3 is configured to provide a control signal. The first relay coil driver node 31 is a first coil driver termination input (e.g., to relay coil termination and protection circuit 14 in FIG. 2). The second relay coil driver node 32 may be configured as the second coil driver termination input. The relay coil driver 3 may be a single-phase or a multi-phase power source. Additionally, the relay coil driver 3 may be an AC power type or a DC power type.

The data communication interface 19 is an optional element that is coupled to the power contact health assessor 1 via one or more communication links 182. The data communication interface 19 may be coupled to external memory and may be used for, e.g., storing and retrieving data.

Data communication may not be required for the full functional operation of the power contact health assessor 1. In some aspects, the data communication interface 19 can include one or more of the following elements: a digital signal isolator, an internal transmit data (TxD) termination, an internal receive data (RxD) termination, an external receive data (Ext RxD) termination, and an external transmit data (Ext TxD) termination.

Data signal filtering, transient, over-voltage, over-current, and wire termination are not shown in the example data communication interface 19 in FIG. 1 and FIG. 2. In some aspects, the data communications interface 19 can be configured as an interface between the power contact health assessor 1 and one or more of the following: a Bluetooth controller, an Ethernet controller, a General Purpose Data Interface, a Human-Machine-Interface, an SPI bus interface, a UART interface, a USB controller, and a Wi-Fi controller.

The dry relay 5 may include two sections—a dry relay coil and dry relay contacts. As mentioned above, "dry" refers to the specific mode of operation of the contacts in this relay which makes or breaks the current connection between the contacts while not carrying current.

The first dry relay node 51 is the first dry relay 5 coil input from the power contact health assessor 1. The second dry relay node 52 is the second dry relay 5 coil input from the power contact health assessor 1. The third dry relay node 53 is the first dry relay contact connection with the main power source 4. The fourth dry relay node 56 is the second dry relay contact connection (e.g., with the wet relay 6). The dry relay 5 may be configured to operate with a single-phase or a multi-phase power source. Additionally, the dry relay 5 may be an AC power type or a DC power type.

The wet relay 6 may include two sections—a wet relay coil and wet relay contacts. As mentioned above, "wet" refers to the specific mode of operation of the contacts in this relay which makes or breaks the current connection between the contacts while carrying current.

The first wet relay node 61 is the first wet relay 6 coil input from the power contact health assessor 1. The second wet relay node 62 is the second wet relay 6 coil input from the power contact health assessor 1. The third wet relay node 63 is the first wet relay contact connection (e.g., with the dry relay). The fourth wet relay node 66 is the second wet relay contact connection (e.g., with the current sensor 127). The wet relay 6 may be configured to operate with a single-phase or a multi-phase power source. Additionally, the wet relay 6 may be an AC power type or a DC power type.

In some aspects, the power contact health assessor 1 is configured to support both the normally open (NO) contacts (also referred to as Form A contacts) and the normally closed (NC) contacts (also referred to as Form B contacts). In some aspects, the power contact health assessor 1 measures, records, and analyzes the time difference between coil activation (or deactivation) and power contact activation (or deactivation). In this regard, by monitoring and measuring contact stick durations (e.g., for multiple contact cycles), the gradual power contact electrode surface degradation/decay/ decay may be detected and the estimated EoL may be predicted in absolute or relative terms for the power contact. For example, the power contact EoL prediction may be expressed in percent of cycles left to EoL, numbers of cycles, etc.

In some aspects, the power contact health assessor 1 contains elements of a wet/dry power contact sequencer. In some aspects, the power contact health assessor 1 contains elements of a power contact fault clearing device. In some aspects, the power contact health assessor 1 contains elements of a power contact End-of-Life predictor. In some aspects, the power contact health assessor 1 contains elements of a power contact electrode surface plasma therapy device. In some aspects, the power contact health assessor 1 contains elements of an arc suppressor (the arc suppressor may be an optional element of the power contact health assessor 1).

The discussed specific power contact health assessor operations may be based on instructions located either in internal or external microcontroller/processor memory. In some aspects, wet/dry power contact sequencing operations may operate in support of the power contact health assessor 1. In some aspects, power contact fault clearing operations may operate in support of the power contact health assessor 1. In some aspects, power contact End-of-Life predictor operations may operate in support of the power contact health assessor 1. In some aspects, power contact electrode surface plasma therapy operation may operate in support of the power contact health assessor 1. The power contact health assessment operations discussed herein may be performed in-situ and in real time, while the contact is performing under regular or abnormal operating conditions. In some aspects, contact maintenance schedules may be based on the actual health conditions of under power operating contacts, as determined one or more of the techniques discussed herein.

Power contact electrodes are micro welded during the make and especially during the make bounce phase of the current carrying contact cycle. Micro welds between contact electrodes are desired for they provide the low contact resistance required for power current conducting. Contact stick duration analysis in the power contact health assessor 1 is a measure of contact performance degradation due to adverse contact conditions due to erosion in the form of and contact electrode surface decomposition. The contact stick duration is the difference between the moment the relay coil driver power de-activates and the power contact separates.

In some aspects, stick duration=time of contact opening–time of coil de-activation. Stick durations are typically measured in milliseconds. Contact stick durations are an indication of contact conditions health (contact stick durations getting longer over time are indications of decaying contact health). Long contact stick durations are an indication of poor contact health. When contact sticking becomes permanent, then the contact has failed. Contact stick durations over 1 second are generally considered a contact failure in the relay industry. In some aspects, stop time to arc minus the start time of the coil signal transition is equivalent to the contact stick duration.

In some aspects, separation of contact detection allows for a predictable timing reference in order to determine the time difference between coil deactivation Form A and the opening of the contact. This time difference is greatly influenced by the duration of contact sticking due to normal contact micro welding. Even if the break of the micro weld takes more than one second, the contact may still prove to be functional albeit passed normal expectations. Once the micro weld cannot be broken anymore by the force of the contactor mechanism which is designed to open the contact or break the micro weld, the contact may be considered failed. In some aspects, contact sticking is the time difference between the coil activation signal to break the contact and the actual contact separation. In this regard, contact sticking may an indication of contact failure and not necessarily an increase in contact resistance.

The power contact health assessor discussed herein may be associated with the following features and benefits: AC or DC coil power and contact operation; authenticity and license control mechanisms; auto detect functions; auto generate service and maintenance calls; auto mode settings; automatic fault detection; automatic power failure coil signal bypass; assessing power contact electrode surface decomposition degree; assessing power contact electrode surface decay; assessing power contact electrode surface decay acceleration; assessing power contact electrode surface decay deceleration; assessing power contact electrode surface decomposition degree; assessing power contact electrode surface health condition; assessing power contact electrode surface performance level; bar graph indicator; behavior pattern learning resulting in out-of-pattern detection and indication; cell phone application; code verification chip; conducting real time power contact health diagnosis; conducting in-situ power contact health diagnosis; diagnosing power contact health symptoms; EMC compliance; enabling off-site troubleshooting; enabling faster cycle times; enabling lower duty cycles; enabling heavy duty operation with lighter duty contactors or relays; enabling high dielectric operation; enabling high power operation; enabling low leakage operation; enabling relays to replace contactors; external and internal contactors or relays; hybrid power relays, contactors and circuit breakers; intelligent hybrid-power-switching controllers; internet appliances; local and remote data access; local and remote firmware upgrades; local and remote register access; local and remote system diagnostics; local and remote troubleshooting; maximizing power contact life; maximizing equipment life; maximizing productivity; minimizing planned maintenance schedules; minimizing unplanned service calls; minimizing down times; minimizing production outages; mode control selection; multi-phase configuration; on-site or off-site troubleshooting; operating mode indication; power indication; processor status indication color codes; single-phase configuration; supporting high dielectric isolation between power source and power load; supporting low leakage current between power source and power load; and trigger automatic service calls.

In some aspects, the power contact health assessor 1 may use the following data communication interfaces: access control, Bluetooth interface, communication interfaces and protocols, encrypted data transmissions, an Ethernet interface, LAN/WAN connectivity, SPI bus interface, UART, a universal data interface, a USB interface, and a Wi-Fi interface.

In some aspects, the power contact health assessor 1 may use the following power contact parameters and interfaces: power contact arc current, power contact arc duration, power contact arc type, power contact arc voltage, power contact break bounce parameters, power contact break bounce duration, power contact current, power contact cycle counts, power contact cycle duration, power contact cycle frequency, power contact cycle times, power contact duty cycle, power contact energy, power contact fault and failure alerts and alarms, power contact fault and failure code clearing, power contact fault and failure detection, power contact fault and failure flash codes, power contact fault and failure history and statistics, power contact fault and failure alert, power contact fault and failure parameters, power contact health, power contact history, power contact hours-of-service, power contact make bounce parameters, power contact make bounce duration, power contact on duration, power contact off duration, power contact power, power contact resistance, power contact stick duration (PCSD), power contact average stick duration (PCASD), power contact peak stick duration (PCPSD), power contact stick duration crest factor (PCSDCF), power contact stick parameters, power contact parameter history, power contact parameter statistics, power contact statistics, power contact status, power contact voltage, and power contact voltage crest factor.

The power contact health assessor 1 or may be associated with the following results and the following beneficial outcomes: reducing or eliminating preventive maintenance program requirements; reducing or eliminating scheduled service calls; reducing or eliminating prophylactic contact, relay or contactor replacements; and power contact life degradation/decay detection. Data communication interfacing may be optional for the discussed health assessor.

In comparison, conventional techniques are based on ex-situ analysis of power contact resistance increase as an indication of power contact decay and a metric for impending power contact failure prediction. Such conventional techniques are not based on in-situ health assessment, not based on mathematical analysis, and not taking into account the instant of power contact separation.

FIG. 2 is a block diagram of an example power contact health assessor 1 with an arc suppressor, according to some embodiments. Referring to FIG. 2, the power contact health assessor 1 comprises an auxiliary power termination and protection circuit 12, a relay coil termination and protection circuit 14, a logic power supply 15, a coil signal converter 16, mode control switches 17, a controller (also referred to as microcontroller or microprocessor) 18, data communication interface 19, a status indicator 110, a code control chip 120, a voltage sensor 123, an overcurrent protection circuit 124, a voltage sensor 125, an arc suppressor 126 (e.g., with a contact separation detector (CSD)), a current sensor 127, a dry coil power switch 111, a dry coil current sensor 113, a wet coil power switch 112, and a wet coil current sensor 114.

The auxiliary power termination and protection circuit 12 is configured to provide external wire termination and protection to all elements of the power contact health assessor 1. The first auxiliary power termination and protection circuit 12 node 121 is the first logic power supply 15 input, the first coil power switch 111 input, and the first coil power switch 112 input. The second auxiliary power termination and protection circuit 12 node 122 is the second logic power supply 15 input, the second coil power switch 111 input, and the second coil power switch 112 input.

In some aspects, the auxiliary power termination and protection circuit 12 is includes one or more of the following elements: a first relay coil driver terminal a second relay coil driver terminal, an overvoltage protection, an overcurrent protection, a reverse polarity protection, optional transient and noise filtering, optional current sensor, and optional voltage sensor.

The relay coil termination and protection circuit 14 provides external wire termination and protection to all elements of the power contact health assessor 1. The first coil termination and protection circuit 14 node 141 is the first coil signal converter circuit 16 input. The second coil termination and protection circuit 14 node 142 is the second coil signal converter 16 input.

In some aspects, the relay coil termination and protection circuit 14 includes one or more of the following elements: a first relay coil driver terminal a second relay coil driver terminal, an overvoltage protection, an overcurrent protection, a reverse polarity protection, optional transient and noise filtering, a current sensor (optional), and a voltage sensor (optional).

The logic power supply 15 is configured to provide logic level voltage to all digital logic elements of the power contact health assessor 1. The first logic power supply output 151 is the positive power supply terminal indicated by the positive power schematic symbol in FIG. 2. The second logic power supply output 152 is the negative power supply terminal indicated by the ground reference symbol in FIG. 2.

In some aspects, the logic power supply 15 includes one or more of the following elements: an AC-to-DC converter, input noise filtering, and transient protection, input bulk energy storage, output bulk energy storage, output noise filtering, a DC-to-DC converter (alternative), an external power converter (alternative), a dielectric isolation (internal or external), an overvoltage protection (internal or external), an overcurrent protection (internal or external), product safety certifications (internal or external), and electromagnetic compatibility certifications (internal or external).

The coil signal converter circuit 16 converts a signal indicative of the energization status of the wet and dry coils from the relay coil driver 3 into a logic level type signal communicated to the controller 18 via node 187 for further processing.

In some aspects, the coil signal converter 16 is comprised of one or more of the following elements: current limiting elements, dielectric isolation, signal indication, signal rectification, optional signal filtering, optional signal shaping, and optional transient and noise filtering.

The mode control switches 17 allow manual selection of specific modes of operation for the power contact health assessor 1. In some aspects, the mode control switches 17 include one or more of the following elements: push buttons for hard resets, clearings or acknowledgements, DIP switches for setting specific modes of operation, and (alternatively in place of push buttons) keypad or keyboard switches.

The controller 18 comprises suitable circuitry, logic, interfaces, and/or code and is configured to control the operation of the power contact health assessor 1 through, e.g., software/firmware-based operations, routines, and programs. The first controller node 181 is the status indicator 110 connection. The second controller node 182 is the data communication interface 19 connection. The third controller node 183 is the dry coil power switch 111 connection. The fourth controller node 184 is the wet coil power switch 112 connection. The fifth controller node 185 is the dry coil current sensor 113 connection. The sixth controller node 186 is the wet coil current sensor 114 connection. The seventh controller node 187 is the coil signal converter circuit 16 connection. The eight controller node 188 is the code control chip 120 connection. The ninth controller node 189 is the mode control switches 17 connection. The tenth controller node 1810 is the overcurrent voltage sensor 123 connection. The eleventh controller node 1811 is the voltage sensor 125 connection. The twelfth controller node 1812 is the are suppressor 126 lock connection. The thirteenth controller node 1813 is the first current sensor 127 connection. The fourteenth controller node 1814 is the second current sensor 127 connection.

In some aspects, controller 18 may be configured to control one or more of the following operations associated with the power contact health assessor 1; algorithm management; authenticity code control management; auto-detect operations; auto-detect functions; automatic normally closed or normally open contact form detection; auto mode settings; coil cycle (Off, Make, On, Break, Off) timing, history, and statistics; coil delay management; history management; power contact sequencing; coil driver signal chatter history and statistics; data management (e.g., monitoring, detecting, recording, logging, indicating, and processing); data value registers for present, last, past, maximum, minimum, mean, average, standard deviation values, etc.; date and time formatting, logging, and recording; embedded microcontroller with clock generation, power on reset, and watchdog timer; error, fault, and failure management; factory default value recovery management; firmware upgrade management; flash code generation; fault indication clearing; fault register reset; hard reset; interrupt management; license code control management; power-on management; power-up sequencing; power hold-over management; power turn-on management; reading from inputs, memory, or registers; register address organization; register data factory default values; register data value addresses; register map organization; soft reset management; SPI bus link management; statistics management; system access management; system diagnostics management; UART communications link management; wet/dry relay coil management; and writing to memory, outputs, and registers.

The status indicator 110 provides audible, visual, or other user alerting methods through operational, health, fault, code indication via specific colors or flash patterns. In some aspects, the status indicator 110 may provide one or more of the following types of indications: bar graphs, graphic display, LEDs, a coil driver fault indication, a coil state indication, a dry coil fault indication, a mode of operation indication, a processor health indication, and wet coil fault indication.

The dry coil power switch 111 connects the externally provided coil power to the dry relay coil 5 via nodes 51 and 52 based on the signal output from controller 18 via command output node 183. In some aspects, the dry coil power switch 111 includes one or more of the following elements: solid-state relays, current limiting elements, and optional electromechanical relays.

The wet coil power switch 112 connects the externally provided coil power to the wet relay coil 6 via nodes 61 and 62 based on the signal output from controller 18 via command output node 184. In some aspects, the wet coil power switch 112 includes one or more of the following elements: solid-state relays, current limiting elements, and optional electromechanical relays.

The dry coil current sensor 113 is configured to sense the value and/or the absence or presence of the dry relay coil 5 current. In some aspects, the dry coil current sensor 113 includes one or more of the following elements: solid-state relays, a reverse polarity protection element, optoisolators, optocouplers, Reed relays and/or Hall effect sensors (optional), SSR AC or DC input (alternative), and SSR AC or DC output (alternative).

The wet coil current sensor 114 is configured to sense the value and/or the absence or presence of the dry relay coil 6 current. In some aspects, the wet coil current sensor 114 includes one or more of the following elements: solid-state relays, a reverse polarity protection element, optoisolators, optocouplers, Reed relays and/or Hall effect sensors (optional), SSR AC or DC input (alternative), and SSR AC or DC output (alternative).

The code control chip 120 is an optional element of the power contact health assessor 1, and it is not required for the fully functional operation of the device. In some aspects, the code control chip 120 may be configured to include application or customer specific code with encrypted or non-encrypted data security. In some aspects, the code control chip 120 function may be implemented externally via the data communication interface 19. In some aspects, the code control chip 120 may be configured to store the following information: access control code and data, alert control code and data, authentication control code and data, encryption control code and data, chip control code and data, license control code and data, validation control code and data, and/or checksum control code and data. In some aspects, the code control chip 120 may be implemented as an internal component of controller 18 or may be a separate circuit that is external to controller 18 (e.g., as illustrated in FIG. 2).

The voltage sensor 123 is configured to monitor the condition of the overcurrent protection 124. In some aspects, the voltage sensor 123 includes one or more of the following elements: solid-state relays, a bridge rectifier, current limiters, resistors, capacitors, reverse polarity protection elements, optoisolators, optocouplers. Reed relays and analog to digital converters (optional).

The overcurrent protection circuit 124 is configured to protect the power contact health assessor 1 from destruction in case of an overcurrent condition. In some aspects, the overcurrent protection circuit 124 includes one of more of the following elements: fusible elements, fusible printed circuit board traces, fuses, and circuit breakers.

The voltage sensor 125 is configured to monitor the voltage across the wet relay 6 contacts. In some aspects, the voltage sensor 125 includes one or more of the following elements: solid-state relays, a bridge rectifier, current limiters, resistors, capacitors, reverse polarity protection elements, and alternative or optional elements such as optoisolators, optocouplers, solid-state relays, Reed relays, and analog-to-digital converters. In some aspects, the voltage sensor 125 may be used for detecting contact separation of the contact electrodes of the wet relay 6. More specifically, the connection 1811 may be used by the controller 18 to detect that a voltage between the contact electrodes of the wet relay 6 measured by the voltage sensor 125 is at a plasma ignition voltage level (or arc initiation voltage level) or above. The controller 18 may determine there is contact separation of the contact electrodes of the wet relay 6 when such voltage levels are reached or exceeded. The determined time of contact separation may be used to determine contact stick duration, which may be used for the power contact health assessment.

The arc suppressor 126 is configured to provide arc suppression for the wet relay 6 contacts. The arc suppressor 126 may be either external to the power contact health assessor 1 or, alternatively, may be implemented as an integrated part of the power contact health assessor 1. The arc suppressor 126 may be configured to operate with a single-phase or a multi-phase power source. Additionally, the arc suppressor 8 may be an AC power type or a DC power type.

In some aspects, the arc suppressor 126 may be deployed for normal load conditions. In some aspects, the arc suppressor 126 may or may not be designed to suppress a contact fault arc in an overcurrent or contact overload condition.

In some aspects, the connection 1812 between the arc suppressor 126 lock and the controller 18 may be used for enabling (unlocking) the arc suppressor (e.g., when the relay coil driver signal is active) or disabling (locking) the arc suppressor (e.g., when the relay coil driver signal is inactive).

In some aspects, the arc suppressor 126 may include a contact separation detector (CSD) (not illustrated in FIG. 2) configured to detect a time instance when the wet relay 6 power contact electrodes separate as part of a contact cycle. A connection with the controller 18 (e.g., 1812) may be used to communicate a contact separation indication of a time instance when the CSD has detected contact separation within a contact cycle of the wet relay 6. The contact separation indication may be used by the controller 18 to provide a power contact health assessment with regard to the condition of the contact electrodes of the wet relay 6.

In some aspects, the arc suppressor 126 may be a single-phase or a multi-phase arc suppressor. Additionally, the arc suppressor may be an AC power type or a DC power type.

The current sensor 127 is configured to monitors the current through the wet relay 6 contacts. In some aspects, the current sensor 126 includes one of more of the following elements: solid-state relays, a bridge rectifier, current limiters, resistors, capacitors, reverse polarity protection elements, and alternative or optional elements such as optoisolators, optocouplers, Reed relays, and analog-to-digital converters.

In some aspects, the controller 18 status indicator output pin (SIO) pin 181 transmits the logic state to the status indicators 110. SIO is the logic label state when the status indicator output is high, and/SIO is the logic label state when the status indicator output is low.

In some aspects, the controller 18 data communication interface connection (TXD/RXD) 182 transmits the data logic state to the data communications interface 19. RXD is the logic label state identifying the receive data communications mark, and/RXD is the logic label state identifying the receive data communications space. TXD is the logic label state identifying the transmit data communications mark, and/TXD is the logic label state identifying the transmit data communications space.

In some aspects, the controller 18 dry coil output (DCO) pin 183 transmits the logic state to the dry coil power switch 111. DCO is the logic label state when the dry coil output is energized, and/DCO is the logic label state when the dry coil output is de-energized.

In some aspects, the controller 18 wet coil output pin (WCO) 184 transmits the logic state to the wet coil power switch 112. WCO is the logic state when the wet coil output is energized, and/WCO is the logic state when the wet coil output is de-energized.

In some aspects, the controller 18 dry coil input pin (DCI) 185 receives the logic state of the dry coil current sensor 113. DCI is the logic state when the dry coil current is absent, and/DCI is the logic state when the dry coil current is present.

In some aspects, the controller 18 wet coil input pin (WCI) 186 receives the logic state of the wet coil current sensor 114. WCI is the logic label state when the wet coil current is absent, and/WCI is the logic label state when the wet coil current is present.

In some aspects, the controller 18 coil driver input pin (CDI) 187 receives the logic state of the coil signal converter 16. CDI is the logic state of the de-energized coil driver. /CDI is the logic state of the energized coil driver.

In some aspects, the controller 18 code control connection (CCC) 188 receives and transmits the logic state of the code control chip 120. CCR is the logic label state identifying the receive data logic high, and/CCR is the logic label state identifying the receive data logic low. CCT is the logic label state identifying the transmit data logic high, and/CCT is the logic label state identifying the transmit data logic low.

In some aspects, the controller 18 mode control switch input pin (S) 189 receives the logic state from the mode control switches 17. S represents the mode control switch open logic state, and /S represents the mode control switch closed logic state.

In some aspects, the controller 18 connection 1810 receives the logic state from the overcurrent protection (OCP) voltage sensor 123. OCPVS is the logic label state when the OCP is not fused open, and/OCPVS is the logic label state when the OCP is fused open.

In some aspects, the controller 18 connection 1811 receives the logic state from the wet contact voltage sensor (VS) 125. WCVS is the logic label state when the VS is transmitting logic high, and/WCVS is the logic label state when the VS is transmitting logic low.

In some aspects, the controller 18 connection 1812 transmits the logic state to the arc suppressor 126 lock. ASL is the logic label state when the arc suppression is locked, and/ ASL is the logic label state when the arc suppression is unlocked.

In some aspects, the controller 18 connections 1813 and 1814 receive the logic state from the contact current sensor 127. CCS is the logic label state when the contact current is absent, and/CCS is the logic label state when the contact current is present.

In some aspects, the controller 18 may configure one or more timers (e.g., in connection with detecting a fault condition and sequencing the deactivation of the wet and dry contacts). Example timer labels and definitions of different timers that may be configured by controller 18 include one or more of the following timers.

In some aspects, the coil driver input delay timer delays the processing for the logic state of the coil driver input signal. COIL_DRIVER_INPUT_DELAY_TIMER is the label when the timer is running.

In some aspects, the switch debounce timer delays the processing for the logic state of the switch input signal. SWITCH_DEBOUNCE_TIMER is the label when the timer is running.

In some aspects, the receive data timer delays the processing for the logic state of the receive data input signal. RECEIVE_DATA_DELAY_TIMER is the label when the timer is running.

In some aspects, the transmit data timer delays the processing for the logic state of the transmit data output signal. TRANSMIT_DATA_DELAY_TIMER is the label when the timer is running.

In some aspects, the wet coil output timer delays the processing for the logic state of the wet coil output signal. WET_COIL_OUTPUT_DELAY_TIMER is the label when the timer is running.

In some aspects, the wet current input timer delays the processing for the logic state of the wet current input signal. WET_CURRENT_INPUT_DELAY_TIMER is the label when the timer is running.

In some aspects, the dry coil output timer delays the processing for the logic state of the dry coil output signal. DRY_COIL_OUTPUT_DELAY_TIMER is the label when the timer is running.

In some aspects, the dry current input timer delays the processing for the logic state of the dry current input signal. DRY_CURRENT_INPUT_DELAY_TIMER is the label when the timer is running.

In some aspects, the signal indicator output delay timer delays the processing for the logic state of the signal indicator output. SIGNAL_INDICATOR_OUTPUT_DELAY_TIMER is the label when the timer is running.

Contact Stick Duration

The power contact stick duration, its growth, and its change of growth as a function of the number of contact cycles within a series of consecutive observation windows and their mathematical analysis are surrogates for the electrode surface degradation/decay and are the basis for power contact health assessment. As mentioned above, the power contact stick duration is the time difference between the coil activation signal to break the power contact and the actual power contact separation.

In some aspects, the power CSD (e.g., located inside the arc suppressor 126 or as a separate circuit) reports the precise moment of contact separation. This is the very moment the contact breaks the micro weld and the two contact electrodes start to move away from each other. Without an arc suppressor, even though the contact is separated, and the electrodes are moving away from each other, due to the maintained arc between the two electrodes, current is still flowing across the contact and through the power load. The power CSD provides a higher degree of prediction accuracy compared to using the moment where the current stops flowing between the separating power contact electrodes when the maintained arc terminates.

In some aspects, analysis of power contact stick duration over time, as the contact keeps on power cycling through its operational life, allows for the power contact health assessment by the health assessor 1. For example, increasing power contact stick durations, as the number of contact cycles increases, is an indication of deteriorating power contact health (e.g., surface electrode degradation/decay).

A certain power contact stick duration is considered by the relay industry as a failure and a permanently welded contact is a failed power contact. When a power contact gets older, the power contact stick duration becomes longer. When the spring force becomes weaker over time then the power contact stick durations become longer. When the current is higher and the micro weld gets stronger, the power contact stick durations become longer. In some aspects, mathematical analysis of power contact stick duration as a function of power contact cycles allows for power contact health assessment. The mathematical analysis compares the power contact stick duration increase between two fixed, non-overlapping sampling windows. Power contact stick duration increase is also an indication of power contact decay and a surrogate for impending power contact failure prediction.

In some aspects, contact sticking (e.g., for normally open NO (Form A) contacts) may be measured as the coil de-energizing event starts the duration timer and the contact load current break arc (or the moment of contact separation) stops the timer.

A contactor is a specific, usually heavy duty, high current, embodiment of a relay. Experimental evidence while investigating power contact electrode surface erosion has shown that the contact stick duration may be used as a surrogate for the power contact health. Further investigation has shown that the power contact stick duration becomes longer and longer as the total number of contact cycles in a power application. The contact stick duration is made worst overtime due to the increased and compounded power contact electrode surface erosion in the form of asperities, craters, and pits. In this regard, while the power contact stick duration increases, the power contact health decreases.

Yet further investigation has shown that the contact stick duration and contact health relationship is neither linear nor following a natural exponential decay law but an exponential decay law in the form of $A(N)=A(ref)*B^N$, where $A(ref)$ is the first reference stick duration from a new condition power contact of a relay or contactor, $A(N)$ is the stick duration after N contact cycles, B is the stick duration growth factor, and N is the number of contact cycles.

In aspects when $A(ref)=40$ ms, the initial reference power contact stick duration $A(N)=1000$ ms, the industry accepted maximum power contact stick duration $N=10,000,000$ cycles (may be considered as a typical "maximum power contact electrical life expectancy"). Therefore, $B=321.87\times 10E-9$. This value is an extremely low stick duration growth rate and may not agree with actual experienced maximum power contact electrical life while operating at rated power loads. Some relay and contactor manufacturers publish load-dependent maximum electrical contact life tables in their datasheets.

Due to inconsistencies and confusion relating to power contact electrical life expectancies, the techniques discussed herein may be used for a power contact health assessor capable of measuring stick durations, calculating, quantitatively and qualitatively assessing the actual health conditions of contacts in power relays and contactors. In some aspects, power contact health assessments may be based on the ratio of power contact average stick durations between two or more windows-of-observation (WoO).

FIG. 3 depicts a logarithmic scale graph 300 of average power contact stick duration for power contact health assessment, according to some embodiments.

In some aspects, the windows-of-observation may be established as follows (and in reference to graph 300 in FIG. 3). After resetting the power contact health assessor or clearing stick duration register, a first window-of-observation (WoO1) may be set-up. The first window-of-observation starts with the first power contact stick duration measurement and ends for example after the 100th stick duration measurement (e.g., N1=100 contact cycles). As seen in FIG. 3, the power contact average stick duration for WoO1 is 31.25 ms.

Subsequent windows-of-observation may be configured based on the first window and the average stick duration of the first window. The second window-of-observation WoO2 starts with the $101^{st}$ measurement. The second window-of-observation may be configured to end when the power contact average stick duration is, e.g., twice (or another multiple) the value of the first window-of-observation average stick duration. In the example in FIG. 3, WoO2 ends when the average stick duration for that window reaches 2×31.25 ms=62.5 ms (at contact cycle N2, where N2 may be different from N1).

The third window-of-observation (WoO3) starts after the second window-of-observation (after the N2 contact cycles). The third window-of-observation ends when the power contact average stick duration is, e.g., twice (or another multiple) the value of the second window-of-observation average stick duration. In the example in FIG. 3, WoO3 ends when the average stick duration for that window reaches 2×62.5 ms=125 ms The fourth window-of-observation (WoO4) starts after the third window-of-observation (after the N3 contact cycles). The fourth window-of-observation ends when the power contact average stick duration is, e.g., twice (or another multiple) the value of the third window-of-observation average stick duration. In the example in FIG. 3, WoO4 ends when the average stick duration for that window reaches 2×125 ms=250 ms The fifth window-of-observation (WoO5) starts after the fourth window-of-observation (after the N4 contact cycles). The fifth window-of-observation ends when the power contact average stick duration is, e.g., twice (or another multiple) the value of the fourth window-of-observation average stick duration. In the example in FIG. 3, WoO5 ends when the average stick duration for that window reaches 2×250 ms=500 ms The sixth window-of-observation (WoO6) starts after the fifth window-of-observation (after the N5 contact cycles). The sixth window-of-observation ends when the power contact average stick duration is, e.g., twice (or another multiple) the value of the fifth window-of-observation average stick duration. In the example in FIG. 3, WoO6 ends when the average stick duration for that window reaches 2×500 ms=1000 ms.

In some aspects, the last window-of-observation (or observation window) is configured so that the average stick duration for that window equals a pre-defined stick duration threshold value (e.g., 1000 ms which is considered an industry limit indicating a contact has failed). Each of the obtained/configured observation windows can be associated with a corresponding health assessment characteristic indicative of the health of the contact electrodes when a contact stick duration for the electrodes falls within the corresponding window. For example, if a contact stick duration is measured at any given moment as 100 ms, a health assessment of "average" may be output as 100 ms falls within observation window WoO3. In some aspects, percentage indications may be used for the health assessment or a bar indicator to provide the power contact health assessment for each of the configured observation windows.

In some aspects, power contact stick duration (PCSD) may be measured for each and every contact break instant as follows: PCSD=Contact Open Time−Coil De-energization Time. In some aspects, the contact open time may not be the same as the load current turn-off time. The load current turns off after the arc is extinguished. Arc burn durations may be up to about one-half power cycle. Furthermore, the arc may re-ignite and keep burning in the following power half cycle. The contact open time is the time when the power contact break arc ignites.

In some aspects, power contact peak stick duration (PCPSD) may be measured and used for power contact health assessment. PCPSD may be measured and recorded as the as the maximum power contact stick duration (PCSD max) within the specific time window-of-observation (or PCPSD=PCSD max).

In some aspects, power contact average stick duration (PCASD) may be measured and used for power contact health assessment. PCASD may be calculated for one or more specific windows-of-observation. PCASD may equal the sum of all stick durations within a defined window of time divided by the number of contact cycles within the specific window-of-observation.

In some aspects, the power contact stick duration crest factor (PCSDCF) may be measured and used for power contact health assessment. PCSDCF may be calculated for one or more specific time windows of observation. PCSTCF may equal the peak stick duration divided by the average stick duration within the specific window-of-observation.

In some aspects, power contact health assessment may be displayed and reported quantitatively in absolute values or relative values, such as absolute quantitatively power contact health conditions including power contact peak stick durations between 0 and 1000 ms.

In some aspects, power contact stick duration crest factors may be calculated as follows for the observation windows in FIG. 3 and used for power contact health assessment: PCSDCF between 128 and 32 for the 0 to 31.25 ms average stick time window-of-observation respectively ("mint/new condition failure"); PCSDCF between 32 and 16 for the 31.25 to 62.5 ms average stick time window-of-observation respectively ("good condition failure"); PCSDCF between 16 and 8 for the 62.5 to 125 ms average stick time window-of-observation respectively ("average condition failure"); PCSDCF between 8 and 4 for the 125 to 250 ms average stick time window-of-observation respectively ("poor condition failure"); PCSDCF between 4 and 2 for the 250 to 500 ms average stick time window-of-observation respectively ("replace condition failure"); and PCSDCF between 2 and 1 for the 500 to 1000 ms average stick time window-of-observation respectively ("failed condition failure").

In some aspects, the following quantitative power contact health assessment may be provided: power contact health condition from 100% to 97% (new); power contact health condition from 97% to 94% (new); power contact health condition from 94% to 87.5% (average); power contact health condition from 87.5% to 75% (poor); power contact health condition from 75% to 50% (replace); and power contact health condition from 50% to 0% (failed).

In some aspects, power contact health assessment may be displayed and reported qualitatively, as follows: "new" for power contact average stick durations (PCASD) from 0 to 31.25 ms; "good" for power contact average stick durations (PCASD) from 31.25 and 62.5 ms; "average" for power contact average stick durations (PCASD) from 62.5 to 125 ms; "poor" for power contact average stick durations (PCASD) from 125 to 250 ms; "replace" for power contact average stick durations (PCASD) from 250 to 500 ms; and "failed" for power contact average stick durations (PCASD) from 500 to 1000 ms.

In some aspects, the power contact health assessor 1 registers may be located internally or externally to the controller 18. For example, the code control chip 120 can be configured to store the power contact health assessor 1 registers that are described hereinbelow.

In some aspects, address and data may be written into or read back from the registers through a communication interface using either UART, SPI or any other processor communication method.

In some aspects, the registers may contain data for the following operations: calculating may be understood to involve performing mathematical operations; controlling may be understood to involve processing input data to produce desired output data; detecting may be understood to involve noticing or otherwise detecting a change in the steady state; indicating may be understood to involve issuing notifications to the users; logging may be understood to involve associating dates, times, and events; measuring may be understood to involve acquiring data values about physical parameters; monitoring may be understood to involve observing the steady states for changes; processing may be understood to involve performing controller or processor-tasks for one or more events; and recording may be understood to involve writing and storing events of interest into mapped registers.

In some aspects, the power contact health assessor 1 registers may contain data arrays, data bits, data bytes, data matrixes, data pointers, data ranges, and data values.

In some aspects, the power contact health assessor 1 registers may store control data, default data, functional data, historical data, operational data, and statistical data. In some aspects, the power contact health assessor 1 registers may include authentication information, encryption information, processing information, production information, security information, and verification information. In some aspects, the power contact health assessor 1 registers may be used in connection with external control, external data processing, factory use, future use, internal control, internal data processing, and user tasks.

In some aspects, reading a specific register byte, bytes, or bits may reset the value to zero (0).

The following are example registers that can be configured for the power contact health assessor 1.

In some aspects, a mode register (illustrated in TABLE 1) may be configured to contain the data bits for the selected mode. The power contact health assessor 1 may be pre-loaded with register default settings. In the default mode, the power contact health assessor 1 may operate stand-alone and independently as instructed by the factory default settings.

In some aspects, the following Read and Write commands may be used in connection with the mode register: Read @ 0x60, and Write @ 0x20.

TABLE 1

| Mode Register | BIT NUMBER | | | | | | | |
|---|---|---|---|---|---|---|---|---|
| FUNCTION | 7 | 6 | 5 | 4 | 3 | 2 | 1 | 0 |
| INDICATE_FAULTS & FAILURES | 1 | — | — | — | — | — | — | — |
| None | 0 | — | — | — | — | — | — | — |
| INDICATE_NONE | — | 1 | — | — | — | — | — | — |
| None | — | 0 | — | — | — | — | — | — |
| INDICATE_ALL | — | — | 1 | — | — | — | — | — |
| None | — | — | 0 | — | — | — | — | — |
| STOP_ON_FAILURE | — | — | — | 1 | — | — | — | — |
| None | — | — | — | 0 | — | — | — | — |
| HALT_ON_FAULT | — | — | — | — | 1 | — | — | — |

TABLE 1-continued

| Mode Register | BIT NUMBER | | | | | | | |
|---|---|---|---|---|---|---|---|---|
| FUNCTION | 7 | 6 | 5 | 4 | 3 | 2 | 1 | 0 |
| None | — | — | — | — | 0 | — | — | — |
| RESET | — | — | — | — | — | 1 | — | — |
| None | — | — | — | — | — | 0 | — | — |
| CLEAR | — | — | — | — | — | — | 1 | — |
| None | — | — | — | — | — | — | 0 | — |
| DEFAULT | — | — | — | — | — | — | — | 1 |
| None | — | — | — | — | — | — | — | 0 |

In some aspects, an alert register (illustrated in TABLE 2) may be configured to contain the data bits for the selected alert method.

In some aspects, the following Read and Write commands may be used in connection with the alert register: Read @ 0x61, and Write @ 0x21.

TABLE 2

| Alert Register | BIT NUMBER | | | | | | | |
|---|---|---|---|---|---|---|---|---|
| FUNCTION | 7 | 6 | 5 | 4 | 3 | 2 | 1 | 0 |
| VOICE | 1 | — | — | — | — | — | — | — |
| None | 0 | — | — | — | — | — | — | — |
| COMM | — | 1 | — | — | — | — | — | — |
| None | — | 0 | — | — | — | — | — | — |
| BUZZER | — | — | 1 | — | — | — | — | — |
| None | — | — | 0 | — | — | — | — | — |
| SPEAKER | — | — | — | 1 | — | — | — | — |
| None | — | — | — | 0 | — | — | — | — |
| RECORD | — | — | — | — | 1 | — | — | — |
| None | — | — | — | — | 0 | — | — | — |
| SOUND | — | — | — | — | — | 1 | — | — |
| None | — | — | — | — | — | 0 | — | — |
| DISPLAY | — | — | — | — | — | — | 1 | — |
| None | — | — | — | — | — | — | 0 | — |
| LED | — | — | — | — | — | — | — | 1 |
| None | — | — | — | — | — | — | — | 0 |

In some aspects, a code control register (illustrated in TABLE 3) may be configured to contain the data array pointers for the selected code type.

In some aspects, the following Read and Write commands may be used in connection with the code control register: Read @ 0x62, and Write @ 0x22.

TABLE 3

| Code Control Register | BIT NUMBER | | | | | | | |
|---|---|---|---|---|---|---|---|---|
| FUNCTION | 7 | 6 | 5 | 4 | 3 | 2 | 1 | 0 |
| CHECKSUM | 1 | — | — | — | — | — | — | — |
| None | 0 | — | — | — | — | — | — | — |
| VALIDATION | — | 1 | — | — | — | — | — | — |
| None | — | 0 | — | — | — | — | — | — |
| LICENSE | — | — | 1 | — | — | — | — | — |
| None | — | — | 0 | — | — | — | — | — |
| CHIP | — | — | — | 1 | — | — | — | — |
| None | — | — | — | 0 | — | — | — | — |
| ENCRYPT | — | — | — | — | 1 | — | — | — |
| None | — | — | — | — | 0 | — | — | — |
| AUTHENTIC | — | — | — | — | — | 1 | — | — |
| None | — | — | — | — | — | 0 | — | — |
| ALERT | — | — | — | — | — | — | 1 | — |
| None | — | — | — | — | — | — | 0 | — |
| ACCESS | — | — | — | — | — | — | — | 1 |
| None | — | — | — | — | — | — | — | 0 |

In some aspects, a contact limits register (illustrated in TABLE 4) may be configured to contain the data array pointers for the selected contact limit specification.

In some aspects, the following Read and Write commands may be used in connection with the contact limits register: Read @ 0x63, and Write @ 0x23.

TABLE 4

| Contact Limits Register | BIT NUMBER | | | | | | | |
|---|---|---|---|---|---|---|---|---|
| FUNCTION | 7 | 6 | 5 | 4 | 3 | 2 | 1 | 0 |
| MAX_MECH_LIFE | 1 | — | — | — | — | — | — | — |
| None | 0 | — | — | — | — | — | — | — |
| MAX_ELEC_LIFE | — | 1 | — | — | — | — | — | — |
| None | — | 0 | — | — | — | — | — | — |
| MAX_CYCLES_PER_MINUTE | — | — | 1 | — | — | — | — | — |
| None | — | — | 0 | — | — | — | — | — |
| MAX_DUTY_CYCLE | — | — | — | 1 | — | — | — | — |
| None | — | — | — | 0 | — | — | — | — |
| MIN_DUTY_CYCLE | — | — | — | — | 1 | — | — | — |
| None | — | — | — | — | 0 | — | — | — |
| MIN_OFF_DURATION | — | — | — | — | — | 1 | — | — |
| None | — | — | — | — | — | 0 | — | — |
| MIN_ON_DURATION | — | — | — | — | — | — | 1 | — |
| None | — | — | — | — | — | — | 0 | — |
| MIN_CYCLE_TIME | — | — | — | — | — | — | — | 1 |
| None | — | — | — | — | — | — | — | 0 |

In some aspects, a data communication register (illustrated in TABLE 5) may be configured to contain the data bits for the selected data communications method.

In some aspects, the following Read and Write commands may be used in connection with the data communication register: Read @ 0x64; and Write @0x24.

TABLE 5

| Data Comm Register | BIT NUMBER | | | | | | | |
|---|---|---|---|---|---|---|---|---|
| FUNCTION | 7 | 6 | 5 | 4 | 3 | 2 | 1 | 0 |
| PROTOCOL | 1 | — | — | — | — | — | — | — |
| None | 0 | — | — | — | — | — | — | — |
| HMI | — | 1 | — | — | — | — | — | — |
| None | — | 0 | — | — | — | — | — | — |
| BLUETOOTH | — | — | 1 | — | — | — | — | — |
| None | — | — | 0 | — | — | — | — | — |
| ETHERNET | — | — | — | 1 | — | — | — | — |
| None | — | — | — | 0 | — | — | — | — |
| WIFI | — | — | — | — | 1 | — | — | — |
| None | — | — | — | — | 0 | — | — | — |
| USB | — | — | — | — | — | 1 | — | — |
| None | — | — | — | — | — | 0 | — | — |
| SPI | — | — | — | — | — | — | 1 | — |
| None | — | — | — | — | — | — | 0 | — |
| UART | — | — | — | — | — | — | — | 1 |
| None | — | — | — | — | — | — | — | 0 |

In some aspects, a coil driver parameter register (illustrated in TABLE 6) may be configured to contain the data array pointers for the selected coil driver parameter specification.

In some aspects, the following Read and Write commands may be used in connection with the coil driver parameter register: Read @ 0x65, and Write @0x25.

TABLE 6

| Coil Driver Parameters Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_PATTERN | 1 | — | — | — | — | — | — | — |
| None | 0 | — | — | — | — | — | — | — |
| COIL_DRIVER_OFF_CHATTER | — | 1 | — | — | — | — | — | — |
| None | — | 0 | — | — | — | — | — | — |
| COIL_DRIVER_ON_CHATTER | — | — | 1 | — | — | — | — | — |
| None | — | — | 0 | — | — | — | — | — |
| COIL_DRIVER_FREQUENCY | — | — | — | 1 | — | — | — | — |
| None | — | — | — | 0 | — | — | — | — |
| COIL_DRIVER_CYCLE_TIME | — | — | — | — | 1 | — | — | — |
| None | — | — | — | — | 0 | — | — | — |
| COIL_DRIVER_DUTY_CYCLE | — | — | — | — | — | 1 | — | — |
| None | — | — | — | — | — | 0 | — | — |
| COIL_DRIVER_ON_DURATION | — | — | — | — | — | — | 1 | — |
| None | — | — | — | — | — | — | 0 | — |
| COIL_DRIVER_OFF_DURATION | — | — | — | — | — | — | — | 1 |
| None | — | — | — | — | — | — | — | 0 |

In some aspects, a coil driver pattern register (illustrated in TABLE 7) may be configured to contain the data bits for the selected coil driver pattern condition.

In some aspects, the following Read and Write commands may be used in connection with the coil driver pattern register: Read @ 0x66, and Write @ 0x26.

TABLE 7

| Coil Driver Pattern Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_PATTERN_AQUIRED | 1 | — | — | — | — | — | — | — |
| None | 0 | — | — | — | — | — | — | — |
| COIL_DRIVER_PATTERN_DETECTED | — | 1 | — | — | — | — | — | — |
| None | — | 0 | — | — | — | — | — | — |
| COIL_DRIVER_PATTERN_LEARNED | — | — | 1 | — | — | — | — | — |
| None | — | — | 0 | — | — | — | — | — |
| OUT_OF_COIL_DRIVER_PATTERN | — | — | — | 1 | — | — | — | — |
| None | — | — | — | 0 | — | — | — | — |
| IN_COIL_DRIVER_PATTERN | — | — | — | — | 1 | — | — | — |
| None | — | — | — | — | 0 | — | — | — |
| NO_COIL_DRIVER_PATTERN | — | — | — | — | — | 1 | — | — |
| None | — | — | — | — | — | 0 | — | — |
| AQUIRE_COIL_DRIVER_PATTERN | — | — | — | — | — | — | 1 | — |
| None | — | — | — | — | — | — | 0 | — |
| IGNORE_COIL_DRIVER_PATTERN | — | — | — | — | — | — | — | 1 |
| None | — | — | — | — | — | — | — | 0 |

In some aspects, a dry coil output delay timer register (illustrated in TABLE 8) may be configured to contain the values for the dry delay timing.

In some aspects, the following Read and Write commands may be used in connection with the dry relay register: Read @ 0x67, and Write @ 0x27.

TABLE 8

| Dry Coil Output Delay Time Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a fault register (illustrated in TABLE 9) may be configured to contain the data bits for the selected fault condition.

In some aspects, the following Read and Write commands may be used in connection with the fault register: Read @ 0x68, and Write @ 0x28.

TABLE 9

| Fault Register | BIT NUMBER | | | | | | | |
|---|---|---|---|---|---|---|---|---|
| FUNCTION | 7 | 6 | 5 | 4 | 3 | 2 | 1 | 0 |
| COMM_FAULT | 1 | — | — | — | — | — | — | — |
| None | 0 | — | — | — | — | — | — | — |
| POWER_BROWN_OUT | — | 1 | — | — | — | — | — | — |
| None | — | 0 | — | — | — | — | — | — |
| WATCH_DOG_TIMER | — | — | 1 | — | — | — | — | — |
| None | — | — | 0 | — | — | — | — | — |
| POWER_FAULT | — | — | — | 1 | — | — | — | — |
| None | — | — | — | 0 | — | — | — | — |
| DEVICE_HEALTH | — | — | — | — | 1 | — | — | — |
| None | — | — | — | — | 0 | — | — | — |
| COIL_DRIVER_FAULT | — | — | — | — | — | 1 | — | — |
| None | — | — | — | — | — | 0 | — | — |
| DRY_COIL_FAULT | — | — | — | — | — | — | 1 | — |
| None | — | — | — | — | — | — | 0 | — |

TABLE 9-continued

| Fault Register | BIT NUMBER | | | | | | | |
|---|---|---|---|---|---|---|---|---|
| FUNCTION | 7 | 6 | 5 | 4 | 3 | 2 | 1 | 0 |
| WET_COIL_FAULT | — | — | — | — | — | — | — | 1 |
| None | — | — | — | — | — | — | — | 0 |

In some aspects, a flash code register (illustrated in TABLE 10) may be configured to contain the data bits for the selected LED flash code colors.

In some aspects, the following Read and Write commands may be used in connection with the flash code register: Read @ 0x69, and Write @ 0x29.

TABLE 10

| LED Flash Code Register | BIT NUMBER | | | | | | | |
|---|---|---|---|---|---|---|---|---|
| FUNCTION | 7 | 6 | 5 | 4 | 3 | 2 | 1 | 0 |
| FLASH_CODE7 | 1 | — | — | — | — | — | — | — |
| None | 0 | — | — | — | — | — | — | — |
| FLASH_CODE6 | — | 1 | — | — | — | — | — | — |
| None | — | 0 | — | — | — | — | — | — |
| FLASH_CODE5 | — | — | 1 | — | — | — | — | — |
| None | — | — | 0 | — | — | — | — | — |
| FLASH_CODE4 | — | — | — | 1 | — | — | — | — |
| None | — | — | — | 0 | — | — | — | — |
| FLASH_CODE3 | — | — | — | — | 1 | — | — | — |
| None | — | — | — | — | 0 | — | — | — |
| FLASH_CODE2 | — | — | — | — | — | 1 | — | — |
| None | — | — | — | — | — | 0 | — | — |
| FLASH_CODE1 | — | — | — | — | — | — | 1 | — |
| None | — | — | — | — | — | — | 0 | — |
| FLASH_CODE0 | — | — | — | — | — | — | — | 1 |
| None | — | — | — | — | — | — | — | 0 |

In some aspects, a history register (illustrated in TABLE 11) may be configured to contain the data array pointers for the selected history information.

In some aspects, the following Read and Write commands may be used in connection with the history register: Read @ 0x6A, and Write @ 0x2A.

TABLE 11

| History Register | BIT NUMBER | | | | | | | |
|---|---|---|---|---|---|---|---|---|
| FUNCTION | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, an input register (illustrated in TABLE 12) may be configured to contain the data bits for the selected input status.

In some aspects, the following Read and Write commands may be used in connection with the input register: Read @ 0x6B, and Write @ 0x2B.

TABLE 12

| Input Register | BIT NUMBER | | | | | | | |
|---|---|---|---|---|---|---|---|---|
| FUNCTION | 7 | 6 | 5 | 4 | 3 | 2 | 1 | 0 |
| DCI | 1 | — | — | — | — | — | — | — |
| None | 0 | — | — | — | — | — | — | — |
| WCI | — | 1 | — | — | — | — | — | — |
| None | — | 0 | — | — | — | — | — | — |
| RXD | — | — | 1 | — | — | — | — | — |
| None | — | — | 0 | — | — | — | — | — |
| S2C | — | — | — | 1 | — | — | — | — |
| None | — | — | — | 0 | — | — | — | — |
| S2B | — | — | — | — | 1 | — | — | — |
| None | — | — | — | — | 0 | — | — | — |
| S2A | — | — | — | — | — | 1 | — | — |
| None | — | — | — | — | — | 0 | — | — |
| S1 | — | — | — | — | — | — | 1 | — |
| None | — | — | — | — | — | — | 0 | — |
| CDI | — | — | — | — | — | — | — | 1 |
| None | — | — | — | — | — | — | — | 0 |

In some aspects, an LED color register (illustrated in TABLE 13) may be configured to contain the data bits for the selected LED color.

In some aspects, the following Read and Write commands may be used in connection with the LED color register: Read @ 0x6C, and Write @ 0x2C.

TABLE 13

| LED Color Register | BIT NUMBER | | | | | | | |
|---|---|---|---|---|---|---|---|---|
| FUNCTION | 7 | 6 | 5 | 4 | 3 | 2 | 1 | 0 |
| RED | 1 | — | — | — | — | — | — | — |
| None | 0 | — | — | — | — | — | — | — |
| RED_ORANGE | — | 1 | — | — | — | — | — | — |
| None | — | 0 | — | — | — | — | — | — |
| ORANGE_YELLOW | — | — | 1 | — | — | — | — | — |
| None | — | — | 0 | — | — | — | — | — |
| ORANGE | — | — | — | 1 | — | — | — | — |
| None | — | — | — | 0 | — | — | — | — |
| YELLOW | — | — | — | — | 1 | — | — | — |
| None | — | — | — | — | 0 | — | — | — |
| YELLOW_GREEN | — | — | — | — | — | 1 | — | — |
| None | — | — | — | — | — | 0 | — | — |
| GREEN_YELLOW | — | — | — | — | — | — | 1 | — |
| None | — | — | — | — | — | — | 0 | — |
| GREEN | — | — | — | — | — | — | — | 1 |
| None | — | — | — | — | — | — | — | 0 |

In some aspects, an output register (illustrated in TABLE 14) may be configured to contain the data bit for the selected output status.

In some aspects, the following Read and Write commands may be used in connection with the output register: Read @ 0x6D, and Write @ 0x2D.

TABLE 14

| Output Register | BIT NUMBER | | | | | | | |
|---|---|---|---|---|---|---|---|---|
| FUNCTION | 7 | 6 | 5 | 4 | 3 | 2 | 1 | 0 |
| WET_COIL_OUTPUT | 1 | — | — | — | — | — | — | — |
| None | 0 | — | — | — | — | — | — | — |
| DRY_COIL_OUTPUT | — | 1 | — | — | — | — | — | — |
| None | — | 0 | — | — | — | — | — | — |
| TXD | — | — | 1 | — | — | — | — | — |
| None | — | — | 0 | — | — | — | — | — |
| ARC_SUPPRESSOR_LOCK | — | — | — | 1 | — | — | — | — |
| None | — | — | — | 0 | — | — | — | — |
| Reserved | — | — | — | — | 1 | — | — | — |
| None | — | — | — | — | 0 | — | — | — |

TABLE 14-continued

| Output Register FUNCTION | BIT NUMBER | | | | | | | |
|---|---|---|---|---|---|---|---|---|
| | 7 | 6 | 5 | 4 | 3 | 2 | 1 | 0 |
| SIGNAL_INDI-CATOR_OUTPUT2 | — | — | — | — | — | 1 | — | — |
| None | — | — | — | — | — | 0 | — | — |
| SIGNAL_INDI-CATOR_OUTPUT1 | — | — | — | — | — | — | 1 | — |
| None | — | — | — | — | — | — | 0 | — |
| Reserved | — | — | — | — | — | — | — | 1 |
| None | — | — | — | — | — | — | — | 0 |

In some aspects, a state register (illustrated in TABLE 15) may be configured to contain the data array pointers for the selected state information.

In some aspects, the following Read and Write commands may be used in connection with the state register: Read @ 0x6E, and Write @ 0x2E.

TABLE 15

| State Register FUNCTION | BIT NUMBER | | | | | | | |
|---|---|---|---|---|---|---|---|---|
| | 7 | 6 | 5 | 4 | 3 | 2 | 1 | 0 |
| WET_COIL_ON | 1 | — | — | — | — | — | — | — |
| None | 0 | — | — | — | — | — | — | — |
| WET_COIL_OPN | — | 1 | — | — | — | — | — | — |
| None | — | 0 | — | — | — | — | — | — |
| WET_COIL_OFF | — | — | 1 | — | — | — | — | — |
| None | — | — | 0 | — | — | — | — | — |
| DRY_COIL_ON | — | — | — | 1 | — | — | — | — |
| None | — | — | — | 0 | — | — | — | — |
| DRY_COIL_OPN | — | — | — | — | 1 | — | — | — |
| None | — | — | — | — | 0 | — | — | — |
| DRY_CQIL_OFF | — | — | — | — | — | 1 | — | — |
| None | — | — | — | — | — | 0 | — | — |
| DRIVER_INPUT_ON | — | — | — | — | — | — | 1 | — |
| None | — | — | — | — | — | — | 0 | — |
| DRIVER_INPUT_OFF | — | — | — | — | — | — | — | 1 |
| None | — | — | — | — | — | — | — | 0 |

In some aspects, a statistics register (illustrated in TABLE 16) may be configured to contain the data array pointers for the selected statistics information.

In some aspects, the following Read and Write commands may be used in connection with the statistics register: Read @ 0x6F; and Write @ 0x2F.

TABLE 16

| Statistics Register FUNCTION | BIT NUMBER | | | | | | | |
|---|---|---|---|---|---|---|---|---|
| | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, a status register (illustrated in TABLE 17) may be configured to contain the data array pointers for the selected status information.

In some aspects, the following Read and Write commands may be used in connection with the status register: Read @ 0x70, and Write @ 0x30.

TABLE 17

| Status Register FUNCTION | BIT NUMBER | | | | | | | |
|---|---|---|---|---|---|---|---|---|
| | 7 | 6 | 5 | 4 | 3 | 2 | 1 | 0 |
| CYCLE_COUNT | 1 | — | — | — | — | — | — | — |
| None | 0 | — | — | — | — | — | — | — |
| OPERATION_HALTED | — | 1 | — | — | — | — | — | — |
| None | — | 0 | — | — | — | — | — | — |
| SYSTEM_READY | — | — | 1 | — | — | — | — | — |
| None | — | — | 0 | — | — | — | — | — |
| FAILURES | — | — | — | 1 | — | — | — | — |
| None | — | — | — | 0 | — | — | — | — |
| FAILURE | — | — | — | — | 1 | — | — | — |
| None | — | — | — | — | 0 | — | — | — |
| FAULTS | — | — | — | — | — | 1 | — | — |
| None | — | — | — | — | — | 0 | — | — |
| FAULT | — | — | — | — | — | — | 1 | — |
| None | — | — | — | — | — | — | 0 | — |
| ALL_SYSTEMS_OK | — | — | — | — | — | — | — | 1 |
| None | — | — | — | — | — | — | — | 0 |

In some aspects, a version register (illustrated in TABLE 18) may be configured to contain the data array pointers for the version information.

In some aspects, the following Read and Write commands may be used in connection with the version register: Read @ 0x71, and Write @ 0x31.

TABLE 18

| Version Register FUNCTION | BIT NUMBER | | | | | | | |
|---|---|---|---|---|---|---|---|---|
| | 7 | 6 | 5 | 4 | 3 | 2 | 1 | 0 |
| PCB_REVISION | 1 | — | — | — | — | — | — | — |
| None | 0 | — | — | — | — | — | — | — |
| ASSEMBLY_REVISION | — | 1 | — | — | — | — | — | — |
| None | — | 0 | — | — | — | — | — | — |
| DATE_CODE | — | — | 1 | — | — | — | — | — |
| None | — | — | 0 | — | — | — | — | — |
| LOT_NUMBER | — | — | — | 1 | — | — | — | — |
| None | — | — | — | 0 | — | — | — | — |
| SERIAL_NUMBER | — | — | — | — | 1 | — | — | — |
| None | — | — | — | — | 0 | — | — | — |
| HARDWARE_VERSION | — | — | — | — | — | 1 | — | — |
| None | — | — | — | — | — | 0 | — | — |
| SOFTWARE_VERSION | — | — | — | — | — | — | 1 | — |
| None | — | — | — | — | — | — | 0 | — |
| FIRMWARE_VERSION | — | — | — | — | — | — | — | 1 |
| None | — | — | — | — | — | — | — | 0 |

In some aspects, a wet coil output delay timer register (illustrated in TABLE 19) may be configured to contain the values for the wet delay timing.

In some aspects, the following Read and Write commands may be used in connection with the wet coil output delay timer register: Read @ 0x72, and Write @ 0x32.

TABLE 19

| Wet Coil Output Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a switch debounce timer register (illustrate in TABLE 20) may be configured to contain a one or more-byte value, such as the values for the switch debounce timing.

In some aspects, the following Read and Write commands may be used in connection with the switch debounce timer register: Read @ 0x73, and Write @0x33.

TABLE 20

| Switch Debounce Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a receive data delay timer register (illustrated in TABLE 21) may be configured to contain one or more-byte value.

In some aspects, the following Read and Write commands may be used in connection with the receive data delay timer register: Read @ 0x74, and Write @0x34.

TABLE 21

| Receive Data Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a transmit data delay timer register (illustrated in TABLE 22) may be configured to contain one or more-byte value.

In some aspects, the following Read and Write commands may be used in connection with the transmit data delay timer register: Read @ 0x75, and Write @ 0x35.

TABLE 22

| Transmit Data Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a wet coil current input delay timer register (illustrated in TABLE 23) may be configured to contain the values for the wet coil output timing.

In some aspects, the following Read and Write commands may be used in connection with the wet coil current input delay timer register: Read @ 0x76, and Write @ 0x36.

TABLE 23

| Wet Coil Current Input Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a dry coil current input delay timer register (illustrated in TABLE 24) may be configured to contain a one or more-byte value.

In some aspects, the following Read and Write commands may be used in connection with the dry coil current input delay timer register: Read @ 0x77, and Write @ 0x37.

TABLE 24

| Dry Coil Current Input Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a signal indicator output delay timer register (illustrated in TABLE 25) may be configured to contain a one or more-byte value.

In some aspects, the following Read and Write commands may be used in connection with the signal indicator output delay timer register: Read @ 0x78, and Write @ 0x38.

TABLE 25

| Signal Indicator Output Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a sensor input register (illustrated in TABLE 26) may be configured to contain the data bits for the selected sensor status.

In some aspects, the following Read and Write commands may be used in connection with the sensor input register: Read @ 0x79, and Write @ 0x39.

TABLE 26

| Sensor Input Register | BIT NUMBER | | | | | | | |
|---|---|---|---|---|---|---|---|---|
| FUNCTION | 7 | 6 | 5 | 4 | 3 | 2 | 1 | 0 |
| Reserved | 1 | — | — | — | — | — | — | — |
| None | 0 | — | — | — | — | — | — | — |
| Reserved | — | 1 | — | — | — | — | — | — |
| None | — | 0 | — | — | — | — | — | — |
| Reserved | — | — | 1 | — | — | — | — | — |
| None | — | — | 0 | — | — | — | — | — |
| Reserved | — | — | — | 1 | — | — | — | — |
| None | — | — | — | 0 | — | — | — | — |

TABLE 26-continued

| Sensor Input Register FUNCTION | BIT NUMBER | | | | | | | |
|---|---|---|---|---|---|---|---|---|
| | 7 | 6 | 5 | 4 | 3 | 2 | 1 | 0 |
| COIL_SIGNAL_PRESENT | — | — | — | — | 1 | — | — | |
| None | — | — | — | — | 0 | — | — | |
| WET_CONTACT_CURRENT_SENSOR_BIT | — | — | — | — | — | 1 | — | — |
| None | — | — | — | — | — | 0 | — | — |
| WET_CONTACT_VOLTAGE_SENSOR_BIT | — | — | — | — | — | — | 1 | — |
| None | — | — | — | — | — | — | 0 | — |
| OCP_VOLTAGE_SENSOR_BIT | — | — | — | — | — | — | — | 1 |
| None | — | — | — | — | — | — | — | 0 |

In some aspects, an overcurrent protection voltage sensor register (illustrated in TABLE 27) may be configured to contain a one or more-byte value.

In some aspects, the following Read and Write commands may be used in connection with the overcurrent protection (OCP) voltage sensor register: Read @ 0x7A, and Write @ 0x3A.

TABLE 27

| OCP Voltage Sensor Register VALUE | BIT NUMBER | | | | | | | |
|---|---|---|---|---|---|---|---|---|
| | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a wet contact voltage sensor register (illustrated in TABLE 28) may be configured to contain a one or more-byte value. The value may be expressed for example but not limited to as average, mean, median, rms or peak.

In some aspects, the following Read and Write commands may be used in connection with the wet contact voltage sensor register: Read @ 0x7B, and Write @ 0x3B.

TABLE 28

| Wet Contact Voltage Sensor Register VALUE | BIT NUMBER | | | | | | | |
|---|---|---|---|---|---|---|---|---|
| | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a wet contact current sensor register (illustrated in TABLE 29) may be configured to contain a one or more-byte value. The value may be expressed for example but not limited to as average, mean, median, rms or peak.

In some aspects, the following Read and Write commands may be used in connection with the wet contact current sensor register: Read @ 0x7C, and Write @ 0x3C.

TABLE 29

| Wet Contact Current Sensor Register VALUE | BIT NUMBER | | | | | | | |
|---|---|---|---|---|---|---|---|---|
| | 7 | 6 | 5 | 4 | 3 | 2 | 1 | 0 |
| Maximum: Max Amps | 1 | 1 | 1 | 1 | 1 | 1 | 1 | 1 |
| Default: none | x | x | x | x | x | x | x | x |
| Minimum: Min Amps | 0 | 0 | 0 | 0 | 0 | 0 | 0 | 0 |

In some aspects, a fault arc register (illustrated in TABLE 30) may be configured to contain the data bits for the selected sensor status.

In some aspects, the following Read and Write commands may be used in connection with the fault arc parameter register: Read @ 0x7D, and Write @0x3D.

TABLE 30

| Fault Arc Register FUNCTION | BIT NUMBER | | | | | | | |
|---|---|---|---|---|---|---|---|---|
| | 7 | 6 | 5 | 4 | 3 | 2 | 1 | 0 |
| FAULT_ARC_ENERGY | 1 | — | — | — | — | — | — | — |
| None | 0 | — | — | — | — | — | — | — |
| FAULT_ARC_DURATION | — | 1 | — | — | — | — | — | — |
| None | — | 0 | — | — | — | — | — | — |
| FAULT_ARC_POWER | — | — | 1 | — | — | — | — | — |
| None | — | — | 0 | — | — | — | — | — |
| FAULT_ARC_RESISTANCE_GRADIENT | — | — | — | 1 | — | — | — | — |
| None | — | — | — | 0 | — | — | — | — |
| FAULT_ARC_RESISTANCE | — | — | — | — | 1 | — | — | — |
| None | — | — | — | — | 0 | — | — | — |
| FAULT_ARC_CURRENT | — | — | — | — | — | 1 | — | — |
| None | — | — | — | — | — | 0 | — | — |
| FAULT_ARC_VOLTAGE_GRADIENT | — | — | — | — | — | — | 1 | — |
| None | — | — | — | — | — | — | 0 | — |
| FAULT_ARC_VOLTAGE | — | — | — | — | — | — | — | 1 |
| None | — | — | — | — | — | — | — | 0 |

In some aspects, an amperage trip point register (illustrated in TABLE 31) may be configured to contain the one or more-byte value for the specific trip point setting. The value may be expressed for example but not limited to as average, mean, median, rms or peak.

In some aspects, the following Read and Write commands may be used in connection with the amperage trip point register: Read @ 0x7E, and Write @0x3E.

TABLE 31

| AMPERAGE TRIP POINT REGSITER VALUE | BIT NUMBER | | | | | | | |
|---|---|---|---|---|---|---|---|---|
| | 7 | 6 | 5 | 4 | 3 | 2 | 1 | 0 |
| Maximum: Max Amps | 1 | 1 | 1 | 1 | 1 | 1 | 1 | 1 |
| Set-Amperage: none selected | x | x | x | x | x | x | x | x |
| Minimum: Min Amps | 0 | 0 | 0 | 0 | 0 | 0 | 0 | 0 |

In some aspects, an amperage trip delay register (illustrated in TABLE 32) may be configured to contain the one or more-byte value for the specific trip point setting. The value may be expressed for example but not limited to as average, mean, median, rms or peak.

In some aspects, the following Read and Write commands may be used in connection with the amperage trip delay register: Read @ 0x7F, and Write @0x3F.

TABLE 32

| Amperage Trip Delay Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Set-Amperage Trip Delay: none selected | x | x | x | x | x | x | x | x |
| Minimum: 0 ms | 0 | 0 | 0 | 0 | 0 | 0 | 0 | 0 |

In some aspects, a fault arc voltage register (illustrated in TABLE 33) may be configured to contain a one or more-byte value. The value may be expressed for example but not limited to as average, mean, median, rms or peak.

In some aspects, the following Read and Write commands may be used in connection with the fault arc voltage register: Read @ 0x80, and Write @ 0x40.

TABLE 33

| Fault Arc Voltage Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a fault arc voltage gradient register (illustrated in TABLE 34) may be configured to contain a one or more-byte value. The value may be expressed for example but not limited to as average, mean, median, rms, and/or peak.

In some aspects, the following Read and Write commands may be used in connection with the fault arc voltage gradient register: Read @ 0x81, and Write @ 0x41.

TABLE 34

| Fault Arc Voltage Gradient Register | BIT NUMBER | | | | | | | |
|---|---|---|---|---|---|---|---|---|
| VALUE | 7 | 6 | 5 | 4 | 3 | 2 | 1 | 0 |
| Maximum: Max dV/dt | 1 | 1 | 1 | 1 | 1 | 1 | 1 | 1 |
| Default: none | x | x | x | x | x | x | x | x |
| Minimum: Min dV/dt | 0 | 0 | 0 | 0 | 0 | 0 | 0 | 0 |

In some aspects, a fault arc current register (illustrated in TABLE 35) may be configured to contain a one or more-byte value. The value may be expressed for example but not limited to as average, mean, median, rms, or peak.

In some aspects, the following Read and Write commands may be used in connection with the fault arc current register: Read @ 0x82, and Write @ 0x42.

TABLE 35

| Fault Arc Current Register | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Default: none | x | x | x | x | x | x | x | x |
| Minimum: Min Amps | 0 | 0 | 0 | 0 | 0 | 0 | 0 | 0 |

In some aspects, a fault arc resistance register (illustrated in TABLE 36) may be configured to contain a one or more-byte value. The value may be expressed for example but not limited to as average, mean, median, rms or peak.

In some aspects, the following Read and Write commands may be used in connection with the fault arc resistance register: Read @ 0x83, and Write @0x43.

TABLE 36

| Fault Arc Resistance Register | BIT NUMBER | | | | | | | |
|---|---|---|---|---|---|---|---|---|
| VALUE | 7 | 6 | 5 | 4 | 3 | 2 | 1 | 0 |
| Maximum: Max Ohms | 1 | 1 | 1 | 1 | 1 | 1 | 1 | 1 |
| Default: none | x | x | x | x | x | x | x | x |
| Maximum: Min Ohms | 0 | 0 | 0 | 0 | 0 | 0 | 0 | 0 |

In some aspects, a fault arc resistance gradient register (illustrated in TABLE 37) may be configured to contain a one or more-byte value. The value may be expressed for example but not limited to as average, mean, median, rms, or peak.

In some aspects, the following Read and Write commands may be used in connection with the fault are resistance gradient register: Read @ 0x84, and Write @ 0x44.

TABLE 37

| Fault Arc Resistance Gradient Register | BIT NUMBER | | | | | | | |
|---|---|---|---|---|---|---|---|---|
| VALUE | 7 | 6 | 5 | 4 | 3 | 2 | 1 | 0 |
| Maximum: Max dΩ/dt | 1 | 1 | 1 | 1 | 1 | 1 | 1 | 1 |
| Default: none | x | x | x | x | x | x | x | x |
| Minimum: Min dΩ/dt | 0 | 0 | 0 | 0 | 0 | 0 | 0 | 0 |

In some aspects, a fault arc power register (illustrated in TABLE 38) may be configured to contain a one or more-byte value. The value may be expressed for example but not limited to as average, mean, median, rms or peak.

In some aspects, the following Read and Write commands may be used in connection with the fault arc power register: Read @ 0x85, and Write @ 0x45.

TABLE 38

| Fault Arc Power Register | BIT NUMBER | | | | | | | |
|---|---|---|---|---|---|---|---|---|
| VALUE | 7 | 6 | 5 | 4 | 3 | 2 | 1 | 0 |
| Maximum: Max Watts | 1 | 1 | 1 | 1 | 1 | 1 | 1 | 1 |
| Default: none | x | x | x | x | x | x | x | x |
| Minimum: Min Watts | 0 | 0 | 0 | 0 | 0 | 0 | 0 | 0 |

In some aspects, a fault arc duration register (illustrated in TABLE 39) may be configured to contain a one or more-byte value. The value may be expressed for example but not limited to as average, mean, median, rms, or peak.

In some aspects, the following Read and Write commands may be used in connection with the fault arc duration register: Read @ 0x86, and Write @ 0x46.

TABLE 39

| Fault Arc Duration Register | BIT NUMBER | | | | | | | |
|---|---|---|---|---|---|---|---|---|
| VALUE | 7 | 6 | 5 | 4 | 3 | 2 | 1 | 0 |
| Maximum: Max seconds | 1 | 1 | 1 | 1 | 1 | 1 | 1 | 1 |
| Default: none | x | x | x | x | x | x | x | x |
| Minimum: Min seconds | 0 | 0 | 0 | 0 | 0 | 0 | 0 | 0 |

In some aspects, a fault arc energy register (illustrated in TABLE 40) may be configured to contain a one or more-byte value. The value may be expressed for example but not limited to as average, mean, median, rms or peak.

In some aspects, the following Read and Write commands may be used in connection with the fault arc energy register: Read @ 0x87, and Write @ 0x47.

TABLE 40

| Fault Arc Energy Register | BIT NUMBER | | | | | | | |
|---|---|---|---|---|---|---|---|---|
| VALUE | 7 | 6 | 5 | 4 | 3 | 2 | 1 | 0 |
| Maximum: Max Joules | 1 | 1 | 1 | 1 | 1 | 1 | 1 | 1 |
| Default: none | x | x | x | x | x | x | x | x |
| Minimum: Min Joules | 0 | 0 | 0 | 0 | 0 | 0 | 0 | 0 |

In some aspects, a break arc register (illustrated in TABLE 41) may be configured to contain a one or more-byte value. In some aspects, the following Read and Write commands may be used in connection with the break arc register: Read @ 0x88, and Write @ 0x48.

TABLE 41

| Break Arc Register | BIT NUMBER | | | | | | | |
|---|---|---|---|---|---|---|---|---|
| FUNCTION | 7 | 6 | 5 | 4 | 3 | 2 | 1 | 0 |
| BREAK_ARC_ENERGY | 1 | — | — | — | — | — | — | — |
| None | 0 | — | — | — | — | — | — | — |
| BREAK_ARC_DURATION | — | 1 | — | — | — | — | — | — |
| None | — | 0 | — | — | — | — | — | — |
| BREAK_ARC_POWER | — | — | 1 | — | — | — | — | — |
| None | — | — | 0 | — | — | — | — | — |
| BREAK_ARC_RESISTANCE_GRADIENT | — | — | — | 1 | — | — | — | — |
| None | — | — | — | 0 | — | — | — | — |
| BREAK_ARC_RESISTANCE | — | — | — | — | 1 | — | — | — |
| None | — | — | — | — | 0 | — | — | — |
| BREAK_ARC_CURRENT | — | — | — | — | — | 1 | — | — |
| None | — | — | — | — | — | 0 | — | — |
| BREAK_ARC_VOLTAGE_GRADIENT | — | — | — | — | — | — | 1 | — |
| None | — | — | — | — | — | — | 0 | — |
| BREAK_ARC_VOLTAGE | — | — | — | — | — | — | — | 1 |
| None | — | — | — | — | — | — | — | 0 |

In some aspects, a make arc register (illustrated in TABLE 42) may be configured to contain a one or more-byte value. In some aspects, the following Read and Write commands may be used in connection with the make arc register: Read @ 0x89, and Write @ 0x49.

TABLE 42

| Make Arc Register | BIT NUMBER | | | | | | | |
|---|---|---|---|---|---|---|---|---|
| FUNCTION | 7 | 6 | 5 | 4 | 3 | 2 | 1 | 0 |
| MAKE_ARC_ENERGY | 1 | — | — | — | — | — | — | — |
| None | 0 | — | — | — | — | — | — | — |
| MAKE_ARC_DURATION | — | 1 | — | — | — | — | — | — |
| None | — | 0 | — | — | — | — | — | — |
| MAKE_ARC_POWER | — | — | 1 | — | — | — | — | — |
| None | — | — | 0 | — | — | — | — | — |
| MAKE_ARC_RESISTANCE_GRADIENT | — | — | — | 1 | — | — | — | — |
| None | — | — | — | 0 | — | — | — | — |
| MAKE_ARC_RESISTANCE | — | — | — | — | 1 | — | — | — |
| None | — | — | — | — | 0 | — | — | — |
| MAKE_ARC_CURRENT | — | — | — | — | — | 1 | — | — |
| None | — | — | — | — | — | 0 | — | — |
| MAKE_ARC_VOLTAGE_GRADIENT | — | — | — | — | — | — | 1 | — |
| None | — | — | — | — | — | — | 0 | — |
| MAKE_ARC_VOLTAGE | — | — | — | — | — | — | — | 1 |
| None | — | — | — | — | — | — | — | 0 |

In some aspects, a contact register (illustrated in TABLE 43) may be configured to contain a one or more-byte value. In some aspects, the following Read and Write commands may be used in connection with the contact register: Read @ 0x8A, and Write @ 0x4A.

TABLE 43

| Contact Register | BIT NUMBER | | | | | | | |
|---|---|---|---|---|---|---|---|---|
| FUNCTION | 7 | 6 | 5 | 4 | 3 | 2 | 1 | 0 |
| CONTACT_HISTORY | 1 | — | — | — | — | — | — | — |
| None | 0 | — | — | — | — | — | — | — |
| CONTACT_STATISTICS | — | 1 | — | — | — | — | — | — |
| None | — | 0 | — | — | — | — | — | — |
| CONTACT_ENERGY | — | — | 1 | — | — | — | — | — |
| None | — | — | 0 | — | — | — | — | — |
| CONTACT_ON_DURATION | — | — | — | 1 | — | — | — | — |
| None | — | — | — | 0 | — | — | — | — |
| CONTACT_POWER | — | — | — | — | 1 | — | — | — |
| None | — | — | — | — | 0 | — | — | — |
| CONTACT_FREQUENCY | — | — | — | — | — | 1 | — | — |
| None | — | — | — | — | — | 0 | — | — |
| CONTACT_VOLTAGE | — | — | — | — | — | — | 1 | — |
| None | — | — | — | — | — | — | 0 | — |
| CONTACT_CURRENT | — | — | — | — | — | — | — | 1 |
| None | — | — | — | — | — | — | — | 0 |

In some aspects, a contact cycle register (illustrated in TABLE 44) may be configured to contain a one or more-byte value. In some aspects, the following Read and Write commands may be used in connection with the contact cycle register: Read @ 0x8B, and Write @ 0x4B.

TABLE 44

| Contact Cycle Register | BIT NUMBER | | | | | | | |
|---|---|---|---|---|---|---|---|---|
| FUNCTION | 7 | 6 | 5 | 4 | 3 | 2 | 1 | 0 |
| CONTACT_CYCLE_HISTORY | 1 | — | — | — | — | — | — | — |
| None | 0 | — | — | — | — | — | — | — |
| CONTACT_CYCLE_STATISTICS | — | 1 | — | — | — | — | — | — |
| None | — | 0 | — | — | — | — | — | — |
| CONTACT_CYCLE_DUTY_CYCLE | — | — | 1 | — | — | — | — | — |
| None | — | — | 0 | — | — | — | — | — |
| CONTACT_CYCLE_ON_DURATION | — | — | — | 1 | — | — | — | — |
| None | — | — | — | 0 | — | — | — | — |
| CONTACT_CYCLE_OFF_DURATION | — | — | — | — | 1 | — | — | — |
| None | — | — | — | — | 0 | — | — | — |

TABLE 44-continued

| Contact Cycle Register | BIT NUMBER | | | | | | | |
|---|---|---|---|---|---|---|---|---|
| FUNCTION | 7 | 6 | 5 | 4 | 3 | 2 | 1 | 0 |
| CONTACT_CYCLE_FREQUENCY | — | — | — | — | — | 1 | — | — |
| None | — | — | — | — | — | 0 | — | — |
| CONTACT_CYCLE_TIME | — | — | — | — | — | — | 1 | — |
| None | — | — | — | — | — | — | 0 | — |
| CONTACT_CYCLE_COUNT | — | — | — | — | — | — | — | 1 |
| None | — | — | — | — | — | — | — | 0 |

In some aspects, a contact stick register (illustrated in TABLE 45) may be configured to contain a one or more-byte value. In some aspects, the following Read and Write commands may be used in connection with the contact stick register: Read @ 0x8C, and Write @ 0x4C.

TABLE 45

| Contact Stick Register | BIT NUMBER | | | | | | | |
|---|---|---|---|---|---|---|---|---|
| FUNCTION | 7 | 6 | 5 | 4 | 3 | 2 | 1 | 0 |
| CONTACT_STICK_HISTORY | 1 | — | — | — | — | — | — | — |
| None | 0 | — | — | — | — | — | — | — |
| CONTACT_STICK_STATISTICS | — | 1 | — | — | — | — | — | — |
| None | — | 0 | — | — | — | — | — | — |
| CONTACT_STICK_REFERENCE_WOO | — | — | 1 | — | — | — | — | — |
| None | — | — | 0 | — | — | — | — | — |
| CONTACT_STICK_WINDOW | — | — | — | 1 | — | — | — | — |
| None | — | — | — | 0 | — | — | — | — |
| CONTACT_STICK_DURATION_CREST_FACTOR | — | — | — | — | 1 | — | — | — |
| None | — | — | — | — | 0 | — | — | — |
| CONTACT_PEAK_STICK_DURATION | — | — | — | — | — | 1 | — | — |
| None | — | — | — | — | — | 0 | — | — |
| CONTACT_AVERAGE_STICK_DURATION | — | — | — | — | — | — | 1 | — |
| None | — | — | — | — | — | — | 0 | — |
| CONTACT_STICK_DURATION | — | — | — | — | — | — | — | 1 |
| None | — | — | — | — | — | — | — | 0 |

In some aspects, a contact health register (illustrated in TABLE 46) may be configured to contain a one or more-byte value. In some aspects, the following Read and Write commands may be used in connection with the contact health register: Read @ 0x8D, and Write @ 0x4D.

TABLE 46

| Contact Health Register | BIT NUMBER | | | | | | | |
|---|---|---|---|---|---|---|---|---|
| FUNCTION | 7 | 6 | 5 | 4 | 3 | 2 | 1 | 0 |
| CONTACT_HEALTH_HISTORY | 1 | — | — | — | — | — | — | — |
| None | 0 | — | — | — | — | — | — | — |
| CONTACT_HEALTH_STATISTICS | — | 1 | — | — | — | — | — | — |
| None | — | 0 | — | — | — | — | — | — |
| CONTACT_HEALTH_FAILURE | — | — | 1 | — | — | — | — | — |
| None | — | — | 0 | — | — | — | — | — |
| CONTACT_HEALTH_REPLACE | — | — | — | 1 | — | — | — | — |
| None | — | — | — | 0 | — | — | — | — |
| CONTACT_HEALTH_POOR | — | — | — | — | 1 | — | — | — |
| None | — | — | — | — | 0 | — | — | — |
| CONTACT_HEALTH_AVERAGE | — | — | — | — | — | 1 | — | — |
| None | — | — | — | — | — | 0 | — | — |
| CONTACT_HEALTH_GOOD | — | — | — | — | — | — | 1 | — |
| None | — | — | — | — | — | — | 0 | — |
| CONTACT_STICK_NEW | — | — | — | — | — | — | — | 1 |
| None | — | — | — | — | — | — | — | 0 |

In some aspects, a contact health assessment register (illustrated in TABLE 47) may be configured to contain a one or more-byte value. In some aspects, the following Read and Write commands may be used in connection with the contact health assessment register: Read @ 0x8E, and Write @ 0x4E.

TABLE 47

| Contact Health Assessment Register | BIT NUMBER | | | | | | | |
|---|---|---|---|---|---|---|---|---|
| VALUE | 7 | 6 | 5 | 4 | 3 | 2 | 1 | 0 |
| Maximum: 100% healthy | 1 | 1 | 1 | 1 | 1 | 1 | 1 | 1 |
| Default: none | x | x | x | x | x | x | x | x |
| Minimum: 0% healthy | 0 | 0 | 0 | 0 | 0 | 0 | 0 | 0 |

In some aspects, a contact fault register (illustrated in TABLE 48) may be configured to contain a one or more-byte value. In some aspects, the following Read and Write commands may be used in connection with the contact fault register: Read @ 0x8F, and Write @ 0x4F.

TABLE 48

| Contact Fault Register | BIT NUMBER | | | | | | | |
|---|---|---|---|---|---|---|---|---|
| FUNCTION | 7 | 6 | 5 | 4 | 3 | 2 | 1 | 0 |
| CONTACT_FAULT_HISTORY | 1 | — | — | — | — | — | — | — |
| None | 0 | — | — | — | — | — | — | — |
| CONTACT_FAULT_STATISTICS | — | 1 | — | — | — | — | — | — |
| None | — | 0 | — | — | — | — | — | — |
| CONTACT_FAULT_ALARM | — | — | 1 | — | — | — | — | — |
| None | — | — | 0 | — | — | — | — | — |
| CONTACT_FAULT_CLEARING | — | — | — | 1 | — | — | — | — |
| None | — | — | — | 0 | — | — | — | — |
| CONTACT_FAULT_FLASH_CODE | — | — | — | — | 1 | — | — | — |
| None | — | — | — | — | 0 | — | — | — |
| CONTACT_FAULT_CODE | — | — | — | — | — | 1 | — | — |
| None | — | — | — | — | — | 0 | — | — |
| CONTACT_FAULT_ALERT | — | — | — | — | — | — | 1 | — |
| None | — | — | — | — | — | — | 0 | — |
| CONTACT_FAULT_DETECTION | — | — | — | — | — | — | — | 1 |
| None | — | — | — | — | — | — | — | 0 |

In some aspects, a contact failure register (illustrated in TABLE 49) may be configured to contain a one or more-byte value. In some aspects, the following Read and Write commands may be used in connection with the contact failure register: Read @ 0x90, and Write @ 0x50.

TABLE 49

| Contact Failure Register | BIT NUMBER | | | | | | | |
|---|---|---|---|---|---|---|---|---|
| FUNCTION | 7 | 6 | 5 | 4 | 3 | 2 | 1 | 0 |
| CONTACT_FAILURE_HISTORY | 1 | — | — | — | — | — | — | — |
| None | 0 | — | — | — | — | — | — | — |
| CONTACT_FAILURE_STATISTICS | — | 1 | — | — | — | — | — | — |
| None | — | 0 | — | — | — | — | — | — |
| CONTACT_FAILURE_ALARM | — | — | 1 | — | — | — | — | — |
| None | — | — | 0 | — | — | — | — | — |
| CONTACT_FAILURE_CLEARING | — | — | — | 1 | — | — | — | — |
| None | — | — | — | 0 | — | — | — | — |
| CONTACT_FAILURE_FLASH_CODE | — | — | — | — | 1 | — | — | — |
| None | — | — | — | — | 0 | — | — | — |
| CONTACT_FAILURE_CODE | — | — | — | — | — | 1 | — | — |
| None | — | — | — | — | — | 0 | — | — |
| CONTACT_FAILURE_ALERT | — | — | — | — | — | — | 1 | — |
| None | — | — | — | — | — | — | 0 | — |
| CONTACT_FAILURE_DETECTION | — | — | — | — | — | — | — | 1 |
| None | — | — | — | — | — | — | — | 0 |

In some aspects, a make bounce arc register (illustrated in TABLE 50) may be configured to contain a one or more-byte value. In some aspects, the following Read and Write commands may be used in connection with the make bounce arc register: Read @ 0x91, and Write @ 0x51.

TABLE 50

| Make Bounce Arc Register | BIT NUMBER | | | | | | | |
|---|---|---|---|---|---|---|---|---|
| FUNCTION | 7 | 6 | 5 | 4 | 3 | 2 | 1 | 0 |
| MAKE_BOUNCE_ARC_ENERGY | 1 | — | — | — | — | — | — | — |
| None | 0 | — | — | — | — | — | — | — |
| MAKE_BOUNCE_ARC_DURATION | — | 1 | — | — | — | — | — | — |
| None | — | 0 | — | — | — | — | — | — |
| MAKE_BOUNCE_ARC_POWER | — | — | 1 | — | — | — | — | — |
| None | — | — | 0 | — | — | — | — | — |
| MAKE_BOUNCE_ARC_BOUNCES | — | — | — | 1 | — | — | — | — |
| None | — | — | — | 0 | — | — | — | — |
| MAKE_BOUNCE_ARC_FREQUENCY | — | — | — | — | 1 | — | — | — |
| None | — | — | — | — | 0 | — | — | — |
| MAKE_BOUNCE_ARC_RESISTANCE | — | — | — | — | — | 1 | — | — |
| None | — | — | — | — | — | 0 | — | — |
| MAKE_BOUNCE_ARC_CURRENT | — | — | — | — | — | — | 1 | — |
| None | — | — | — | — | — | — | 0 | — |
| MAKE_BOUNCE_ARC_VOLTAGE | — | — | — | — | — | — | — | 1 |
| None | — | — | — | — | — | — | — | 0 |

In some aspects, a break bounce arc register (illustrated in TABLE 51) may be configured to contain a one or more-byte value. In some aspects, the following Read and Write commands may be used in connection with the break bounce arc register: Read @ 0x92, and Write @ 0x52.

TABLE 51

| Break Bounce Arc Register | BIT NUMBER | | | | | | | |
|---|---|---|---|---|---|---|---|---|
| FUNCTION | 7 | 6 | 5 | 4 | 3 | 2 | 1 | 0 |
| BREAK_BOUNCE_ARC_ENERGY | 1 | — | — | — | — | — | — | — |
| None | 0 | — | — | — | — | — | — | — |
| BREAK_BOUNCE_ARC_DURATION | — | 1 | — | — | — | — | — | — |
| None | — | 0 | — | — | — | — | — | — |
| BREAK_BOUNCE_ARC_POWER | — | — | 1 | — | — | — | — | — |
| None | — | — | 0 | — | — | — | — | — |
| BREAK_BOUNCE_ARC_BOUNCES | — | — | — | 1 | — | — | — | — |
| None | — | — | — | 0 | — | — | — | — |
| BREAK_BOUNCE_ARC_FREQUENCY | — | — | — | — | 1 | — | — | — |
| None | — | — | — | — | 0 | — | — | — |
| BREAK_BOUNCE_ARC_RESISTANCE | — | — | — | — | — | 1 | — | — |
| None | — | — | — | — | — | 0 | — | — |
| BREAK_BOUNCE_ARC_CURRENT | — | — | — | — | — | — | 1 | — |
| None | — | — | — | — | — | — | 0 | — |
| BREAK_BOUNCE_ARC_VOLTAGE | — | — | — | — | — | — | — | 1 |
| None | — | — | — | — | — | — | — | 0 |

Figure 4:
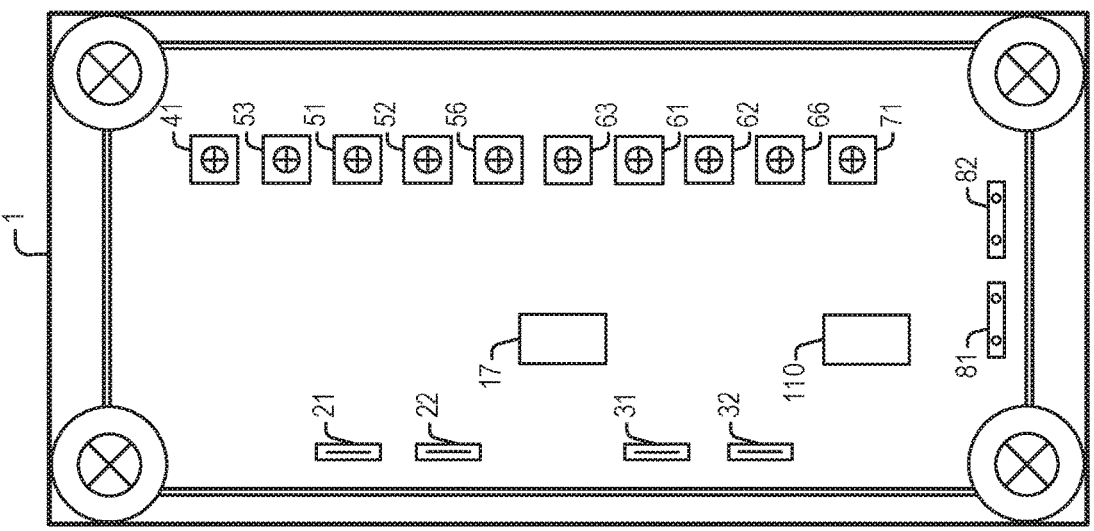
FIG. 4 depicts a packaging example of a health assessor, according to some embodiments.

FIG. 4 depicts a packaging example 400 of a health assessor, such as power contact health assessor 1 of FIGS. 1-2, according to some embodiments.

Additional Examples

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Example 1 is an electrical circuit, comprising: a pair of terminals adapted to be connected to a set of switchable contact electrodes of a power contact; a power switching circuit operatively coupled to the pair of terminals, the power switching circuit configured to switch power from an external power source and to trigger activation of the set of switchable contact electrodes based on a first logic state signal or deactivation of the set of switchable contact electrodes based on a second logic state signal; a contact separation detector operatively coupled to the pair of terminals, the contact separation detector configured to determine a time of separation of the set of switchable contact electrodes of the power contact during the deactivation; and a controller circuit operatively coupled to the pair of terminals, the power switching circuit, and the contact separation detector, the controller circuit configured to: for each contact cycle of a plurality of contact cycles of the power contact within a first observation window; generate the second logic state signal to trigger the deactivation of the set of switchable contact electrodes; and determine a contact stick duration associated with the set of switchable contact electrodes, the contact stick duration based on a difference between a time the second logic state signal is generated and the time of separation during the contact cycle; determine an average contact stick duration for the first observation window based on the contact stick duration for each contact cycle within the first observation window; configure one or more additional observation windows with corresponding average contact stick durations based on the average stick duration for the first observation window; and generate a health assessment for the set of switchable contact electrodes of the power contact based on a subsequent contact stick duration determined after the first observation window and the corresponding average contact stick durations for the one or more additional observation windows.

In Example 2, the subject matter of Example 1 includes, wherein the controller circuit is configured to derive each of the corresponding average stick durations from an average stick duration of a previous observation window.

In Example 3, the subject matter of Example 2 includes, wherein the one or more additional observation windows comprise: a second observation window associated with a second average contact stick duration, the second average contact stick duration being a first multiple of the average contact stick duration for the first observation window; a third observation window associated with a third average contact stick duration, the third average contact stick duration being a second multiple of the second average contact stick duration; a fourth observation window associated with a fourth average contact stick duration, the fourth average contact stick duration being a third multiple of the third average contact stick duration; a fifth observation window associated with a fifth average contact stick duration, the fifth average contact stick duration being a fourth multiple of the fourth average contact stick duration; and a sixth observation window associated with a sixth average contact stick duration, the sixth average contact stick duration being a fifth multiple of the fifth average contact stick duration.

In Example 4, the subject matter of Example 3 includes, wherein the first, second, third, fourth, and fifth multiples are equal to a multiple of 2.

In Example 5, the subject matter of Examples 3-4 includes, wherein each of the observation window and the one or more additional observation windows is associated with a contact health assessment characteristic of a plurality of available health assessment characteristics.

In Example 6, the subject matter of Example 5 includes, wherein the plurality of health assessment characteristics include: a "new condition" health assessment characteristic associated with the first observation window; a "good condition" health assessment characteristic associated with the second observation window; an "average condition" health assessment characteristic associated with the third observation window; a "poor condition" health assessment characteristic associated with the fourth observation window; a "replace condition" health assessment characteristic associated with the fifth observation window; and a "failed condition" health assessment characteristic associated with the sixth observation window.

In Example 7, the subject matter of Examples 1-6 includes, wherein the controller circuit is configured to configure a last one of the one or more additional observation windows to include an observation window with an average contact stick duration equal to a pre-configured contact stick duration threshold associated with a failed set of switchable contact electrodes.

In Example 8, the subject matter of Example 7 includes, wherein the pre-configured contact stick duration threshold is 1 second or greater.

In Example 9, the subject matter of Examples 3-8 includes, wherein the controller circuit is configured to determine a power contact stick duration crest factor (PCSDCF) for the first observation window, based on a peak contact stick duration during the first observation window divided by the average contact stick duration.

In Example 10, the subject matter of Example 9 includes, wherein the controller circuit is configured to determine additional PCSDCFs for each of the one or more additional observation windows, based on corresponding peak contact stick durations and the corresponding average contact stick durations for each of the one or more additional observation windows.

In Example 11, the subject matter of Example 10 includes, wherein the controller circuit is configured to generate the health assessment for the set of switchable contact electrodes of the power contact based on a comparison of a subsequent PCSDCF associated with a subsequent contact stick duration determined after the first observation window with the PCSDCF and the additional PCSDCFs.

In Example 12, the subject matter of Examples 10-11 includes, wherein the average contact stick duration is 31.25 ms and the PCSDCF for the first observation window is between 128 and 32.

In Example 13, the subject matter of Example 12 includes, wherein: the second average contact stick duration is 62.5 ms and the PCSDCF for the second observation window is between 32 and 16; the third average contact stick duration is 125 ms and the PCSDCF for the third observation window is between 16 and 8; the fourth average contact stick duration is 250 ms and the PCSDCF for the fourth observation window is between 8 and 4; the fifth average contact stick duration is 500 ms and the PCSDCF for the fifth observation window is between 4 and 2, and the sixth average contact stick duration is 1000 ms and the PCSDCF for the sixth observation window is between 2 and 1.

In Example 14, the subject matter of Examples 1-13 includes, an arc suppressor adapted to be coupled to the set of switchable contact electrodes, the arc suppressor including the contact separation detector.

In Example 15, the subject matter of Examples 1-14 includes, wherein the contact separation detector comprises a voltage sensor configured to sense voltage across the switchable contact electrodes.

In Example 16, the subject matter of Example 15 includes, wherein the voltage sensor is configured to determine the time of separation of the set of switchable contact electrodes of the power contact during the deactivation when the voltage across the switchable contact electrodes is higher than a plasma ignition voltage level.

Example 17 is a system, comprising: a pair of terminals adapted to be connected to a set of switchable contact electrodes of a power contact; a contact separation detector configured to determine a time of separation of the set of switchable contact electrodes during deactivation of the power contact; and a controller circuit operatively coupled to the pair of terminals and the contact separation detector, the controller circuit configured to: determine within a first observation window, a plurality of contact stick durations associated with the set of switchable contact electrodes, wherein each contact stick duration of the plurality of contact stick durations is determined during a corresponding contact cycle of a plurality of contact cycles of the power contact within the first observation window, and is based on a time duration between generation of a logic state signal triggering the deactivation and the time of separation of the set of switchable contact electrodes; determine an average contact stick duration for the first observation window based on the plurality of contact stick durations; configure one or more additional observation windows with corresponding average contact stick durations, the corresponding average contact stick durations determined based on the average stick duration for the first observation window; and generate a health assessment for the set of switchable contact electrodes of the power contact based on a subsequent contact stick duration for a contact cycle after the first observation window and the corresponding average contact stick durations for the one or more additional observation windows.

In Example 18, the subject matter of Example 17 includes, wherein the controller circuit is configured to derive each of the corresponding average stick durations from an average stick duration of a previous observation window.

In Example 19, the subject matter of Example 18 includes, wherein the one or more additional observation windows comprise: a second observation window associated with a second average contact stick duration, the second average contact stick duration being a first multiple of the average contact stick duration for the first observation window; a third observation window associated with a third average contact stick duration, the third average contact stick duration being a second multiple of the second average contact stick duration; a fourth observation window associated with a fourth average contact stick duration, the fourth average contact stick duration being a third multiple of the third average contact stick duration; a fifth observation window associated with a fifth average contact stick duration, the fifth average contact stick duration being a fourth multiple of the fourth average contact stick duration; and a sixth observation window associated with a sixth average contact stick duration, the sixth average contact stick duration being a fifth multiple of the fifth average contact stick duration.

In Example 20, the subject matter of Example 19 includes, wherein the first, second, third, fourth, and fifth multiples are equal to a multiple of 2.

In Example 21, the subject matter of Examples 19-20 includes, wherein each of the observation window and the one or more additional observation windows is associated with a contact health assessment characteristic of a plurality of available health assessment characteristics.

In Example 22, the subject matter of Example 21 includes, wherein the plurality of health assessment characteristics include: a "new condition" health assessment characteristic associated with the first observation window; a "good condition" health assessment characteristic associated with the second observation window; an "average condition" health assessment characteristic associated with the third observation window; a "poor condition" health assessment characteristic associated with the fourth observation window; a "replace condition" health assessment characteristic associated with the fifth observation window; and a "failed condition" health assessment characteristic associated with the sixth observation window.

In Example 23, the subject matter of Examples 17-22 includes, wherein the controller circuit is configured to configure a last one of the one or more additional observation windows to include an observation window with an average contact stick duration equal to a pre-configured contact stick duration threshold associated with a failed set of switchable contact electrodes.

In Example 24, the subject matter of Example 23 includes, wherein the pre-configured contact stick duration threshold is 1 second or greater.

Example 25 is a method, comprising: coupling a contact separation detector to a pair of terminals of a power contact, the contact separation detector configured to determine a time of separation of a set of switchable contact electrodes of the power contact during deactivation of the power contact based on a logic state signal; coupling a controller circuit to the pair of terminals and the contact separation detector, the controller circuit configured to determine a plurality of stick durations associated with the set of switchable contact electrodes, wherein each stick duration of the plurality of stick durations is determined during a corresponding contact cycle of a plurality of contact cycles of the power contact within a first observation window, and is based on a time duration between generation of the logic state signal triggering the deactivation and the time of separation of the set of switchable contact electrodes; determining an average contact stick duration for the first observation window based on the plurality of contact stick durations; configuring one or more additional observation windows with corresponding average contact stick durations, the corresponding average contact stick durations determined based on the average stick duration for the first observation window; and generating a health assessment for the set of switchable contact electrodes of the power contact based on a subsequent contact stick duration for a contact cycle after the first observation window and the corresponding average contact stick durations for the one or more additional observation windows.

Example 26 is at least one machine-readable medium including instructions that, when executed by processing circuitry, cause the processing circuitry to perform operations to implement of any of Examples 1-25.

Example 27 is an apparatus comprising means to implement of any of Examples 1-25.

Example 28 is a system to implement of any of Examples 1-25.

Example 29 is a method to implement of any of Examples 1-25.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the scope disclosed herein.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, the inventive subject matter may lie in less than all features of a particular disclosed embodiment. Thus, the following claims are hereby incorporated into the Detailed Description, with each claim standing on its own as a separate embodiment.

What is claimed is:

1. An electrical circuit, comprising:
    a pair of terminals adapted to be connected to a set of switchable contact electrodes of a power contact;
    a power switching circuit operatively coupled to the pair of terminals, the power switching circuit configured to switch power from an external power source and to trigger activation of the set of switchable contact electrodes based on a first logic state signal or deactivation of the set of switchable contact electrodes based on a second logic state signal;
    a contact separation detector operatively coupled to the pair of terminals, the contact separation detector configured to determine a time of separation of the set of switchable contact electrodes of the power contact during the deactivation; and
    a controller circuit operatively coupled to the pair of terminals, the power switching circuit, and the contact separation detector, the controller circuit configured to:
        for each contact cycle of a plurality of contact cycles of the power contact within a first observation window:
            generate the second logic state signal to trigger the deactivation of the set of switchable contact electrodes; and
            determine a contact stick duration associated with the set of switchable contact electrodes, the contact stick duration based on a difference between a time the second logic state signal is generated and the time of separation during the contact cycle;
        determine an average contact stick duration for the first observation window based on the contact stick duration for each contact cycle within the first observation window; and
        configure one or more additional observation windows with corresponding average contact stick durations based on the average stick duration for the first observation window;
    wherein a health assessment for the set of switchable contact electrodes of the power contact is based on a subsequent contact stick duration after the first observation window and the corresponding average contact stick durations for the one or more additional observation windows.

2. The electrical circuit of claim 1, wherein the controller circuit is configured to:
    derive each of the corresponding average stick durations from an average stick duration of a previous observation window.

3. The electrical circuit of claim 2, wherein the one or more additional observation windows comprise:
    a second observation window associated with a second average contact stick duration, the second average contact stick duration being a first multiple of the average contact stick duration for the first observation window;
    a third observation window associated with a third average contact stick duration, the third average contact stick duration being a second multiple of the second average contact stick duration;
    a fourth observation window associated with a fourth average contact stick duration, the fourth average contact stick duration being a third multiple of the third average contact stick duration;
    a fifth observation window associated with a fifth average contact stick duration, the fifth average contact stick duration being a fourth multiple of the fourth average contact stick duration; and
    a sixth observation window associated with a sixth average contact stick duration, the sixth average contact stick duration being a fifth multiple of the fifth average contact stick duration.

4. The electrical circuit of claim 3, wherein the first, second, third, fourth, and fifth multiples are equal to a multiple of 2.

5. The electrical circuit of claim 3, wherein each of the observation window and the one or more additional observation windows is associated with a contact health assessment characteristic of a plurality of available health assessment characteristics.

6. The electrical circuit of claim 5, wherein the plurality of health assessment characteristics include:
    a "new condition" health assessment characteristic associated with the first observation window;
    a "good condition" health assessment characteristic associated with the second observation window;
    an "average condition" health assessment characteristic associated with the third observation window;
    a "poor condition" health assessment characteristic associated with the fourth observation window;
    a "replace condition" health assessment characteristic associated with the fifth observation window; and
    a "failed condition" health assessment characteristic associated with the sixth observation window.

7. The electrical circuit of claim 6, wherein:
    the average contact stick duration is 31.25 for the first observation window;
    the second average contact stick duration is 62.5 ms for the second observation window;
    the third average contact stick duration is 125 ms for the third observation window;

the fourth average contact stick duration is 250 ms for the fourth observation window;
the fifth average contact stick duration is 500 ms for the fifth observation window; and
the sixth average contact stick duration is 1000 ms for the sixth observation window.

8. The electrical circuit of claim 1, wherein the controller circuit is configured to:
configure a last one of the one or more additional observation windows to include an observation window with an average contact stick duration equal to a pre-configured contact stick duration threshold associated with a failed set of switchable contact electrodes; and
wherein the pre-configured contact stick duration threshold is 1 second or greater.

9. The electrical circuit of claim 3, wherein the controller circuit is configured to:
determine a power contact stick duration crest factor (PCSDCF) for the first observation window, based on a peak contact stick duration during the first observation window divided by the average contact stick duration.

10. The electrical circuit of claim 9, wherein the controller circuit is configured to:
determine additional PCSDCFs for each of the one or more additional observation windows, based on corresponding peak contact stick durations and the corresponding average contact stick durations for each of the one or more additional observation windows.

11. The electrical circuit of claim 10, wherein the controller circuit is configured to:
generate the health assessment for the set of switchable contact electrodes of the power contact based on a comparison of a subsequent PCSDCF associated with a subsequent contact stick duration determined after the first observation window with the PCSDCF and the additional PCSDCFs.

12. The electrical circuit of claim 10, wherein the average contact stick duration is 31.25 ms and the PCSDCF for the first observation window is between 128 and 32.

13. The electrical circuit of claim 12, wherein:
the second average contact stick duration is 62.5 ms and the PCSDCF for the second observation window is between 32 and 16;
the third average contact stick duration is 125 ms and the PCSDCF for the third observation window is between 16 and 8;
the fourth average contact stick duration is 250 ms and the PCSDCF for the fourth observation window is between 8 and 4;
the fifth average contact stick duration is 500 ms and the PCSDCF for the fifth observation window is between 4 and 2; and
the sixth average contact stick duration is 1000 ms and the PCSDCF for the sixth observation window is between 2 and 1.

14. The electrical circuit of claim 1, further comprising:
an arc suppressor adapted to be coupled to the set of switchable contact electrodes, the arc suppressor including the contact separation detector.

15. The electrical circuit of claim 1, wherein the contact separation detector comprises a voltage sensor configured to sense voltage across the switchable contact electrodes.

16. The electrical circuit of claim 15, wherein the voltage sensor is configured to:
determine the time of separation of the set of switchable contact electrodes of the power contact during the deactivation when the voltage across the switchable contact electrodes is higher than a plasma ignition voltage level.

17. A system, comprising:
a pair of terminals adapted to be connected to a set of switchable contact electrodes of a power contact;
a contact separation detector configured to determine a time of separation of the set of switchable contact electrodes during deactivation of the power contact; and
a controller circuit operatively coupled to the pair of terminals and the contact separation detector, the controller circuit configured to:
determine, within a first observation window, a plurality of contact stick durations associated with the set of switchable contact electrodes, wherein each contact stick duration of the plurality of contact stick durations is determined during a corresponding contact cycle of a plurality of contact cycles of the power contact within the first observation window, and is based on a time duration between generation of a logic state signal triggering the deactivation and the time of separation of the set of switchable contact electrodes;
determine an average contact stick duration for the first observation window based on the plurality of contact stick durations; and
configure one or more additional observation windows with corresponding average contact stick durations, the corresponding average contact stick durations determined based on the average stick duration for the first observation window;
wherein a health assessment for the set of switchable contact electrodes of the power contact is based on a subsequent contact stick duration for a contact cycle after the first observation window and the corresponding average contact stick durations for the one or more additional observation windows.

18. The system of claim 17, wherein the controller circuit is configured to:
derive each of the corresponding average stick durations from an average stick duration of a previous observation window.

19. The system of claim 18, wherein the one or more additional observation windows comprise:
a second observation window associated with a second average contact stick duration, the second average contact stick duration being a first multiple of the average contact stick duration for the first observation window;
a third observation window associated with a third average contact stick duration, the third average contact stick duration being a second multiple of the second average contact stick duration;
a fourth observation window associated with a fourth average contact stick duration, the fourth average contact stick duration being a third multiple of the third average contact stick duration;
a fifth observation window associated with a fifth average contact stick duration, the fifth average contact stick duration being a fourth multiple of the fourth average contact stick duration; and
a sixth observation window associated with a sixth average contact stick duration, the sixth average contact stick duration being a fifth multiple of the fifth average contact stick duration.

20. The system of claim 17, wherein the controller circuit is configured to:

configure a last one of the one or more additional observation windows to include an observation window with an average contact stick duration equal to a pre-configured contact stick duration threshold associated with a failed set of switchable contact electrodes.

\* \* \* \* \*